United States Patent
Chappell et al.

(10) Patent No.: US 11,899,349 B1
(45) Date of Patent: Feb. 13, 2024

(54) SYSTEMS FOR IMAGE PROJECTION

(71) Applicant: Quick Quack Car Wash Holdings, LLC, Roseville, CA (US)

(72) Inventors: Christopher Clinton Chappell, Lincoln, CA (US); McNamara Marlow Pope, III, Fair Oaks, CA (US); Rodney Daniel Sparks, Antelope, CA (US)

(73) Assignee: Quick Quack Car Wash Holdings, LLC

( * ) Notice: Subject to any disclaimer, the term of this patent is extended or adjusted under 35 U.S.C. 154(b) by 0 days.

(21) Appl. No.: 18/195,719

(22) Filed: May 10, 2023

(51) Int. Cl.
*G03B 21/16* (2006.01)
*H05K 7/20* (2006.01)

(52) U.S. Cl.
CPC ......... *G03B 21/16* (2013.01); *H05K 7/20136* (2013.01); *H05K 7/20272* (2013.01); *H05K 7/20409* (2013.01)

(58) Field of Classification Search
None
See application file for complete search history.

(56) References Cited

U.S. PATENT DOCUMENTS

| | | | |
|---|---|---|---|
| 9,661,235 B2 | 5/2017 | Petty | |
| 2005/0117077 A1* | 6/2005 | Utsunomiya | G03B 21/16 349/5 |
| 2008/0272453 A1 | 11/2008 | Richardson | |
| 2016/0299414 A1* | 10/2016 | Usuda | G03B 21/16 |

FOREIGN PATENT DOCUMENTS

| | | | | |
|---|---|---|---|---|
| CN | 204439998 U | * | 7/2015 | |
| CN | 107290915 A | * | 10/2017 | G03B 21/16 |
| JP | 2004341179 A | * | 12/2004 | |
| JP | 2006221277 A | * | 8/2006 | |
| JP | 4496868 B2 | | 7/2010 | |
| WO | 2019/061096 A1 | | 4/2019 | |

* cited by examiner

*Primary Examiner* — Bao-Luan Q Le
*Assistant Examiner* — Danell L Owens
(74) *Attorney, Agent, or Firm* — Caldwell Intellectual Property Law

(57) ABSTRACT

An apparatus for image projection is disclosed herein. In some embodiments, an apparatus may include an image projection device, a sealed housing, and a cooling system. A sealed housing may be configured to protect an image projection device from a foreign element. A sealed housing may include an image output window. A cooling system may include a cooling pad and a coolant reservoir. A cooling system may be configured to modulate the temperature of the image projection device.

20 Claims, 14 Drawing Sheets

SYSTEMS FOR IMAGE PROJECTION

FIELD OF THE INVENTION

The present invention generally relates to the field of image projection. In particular, the present invention is directed to systems for image projection.

BACKGROUND

Typical image projection devices may not be suitable for a car wash environment due to, for example, the presence of elements that may damage a projection device and/or a level of heat in such an environment.

SUMMARY OF THE DISCLOSURE

In an aspect, an apparatus for image projection includes an image projection device; a sealed housing configured to protect the image projection device from a foreign element; and a cooling system comprising a cooling pad; wherein the housing comprises an image output window; wherein the cooling pad comprises a coolant reservoir; wherein the cooling system is configured to modulate the temperature of the image projection device.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

The drawings are not necessarily to scale and may be illustrated by phantom lines, diagrammatic representations and fragmentary views. In certain instances, details that are not necessary for an understanding of the embodiments or that render other details difficult to perceive may have been omitted.

DETAILED DESCRIPTION

At a high level, aspects of the present disclosure are directed to systems and methods for image projection. In some embodiments, an apparatus may include a housing, a digital image projection device, a digital signage player, a power source, an I/O assembly, one or more ports, a cooling system, and a housing. In some embodiments, an apparatus may project an image and/or a video onto foam on a window such as a windshield of a vehicle while the vehicle is in a car wash.

Figure 1:
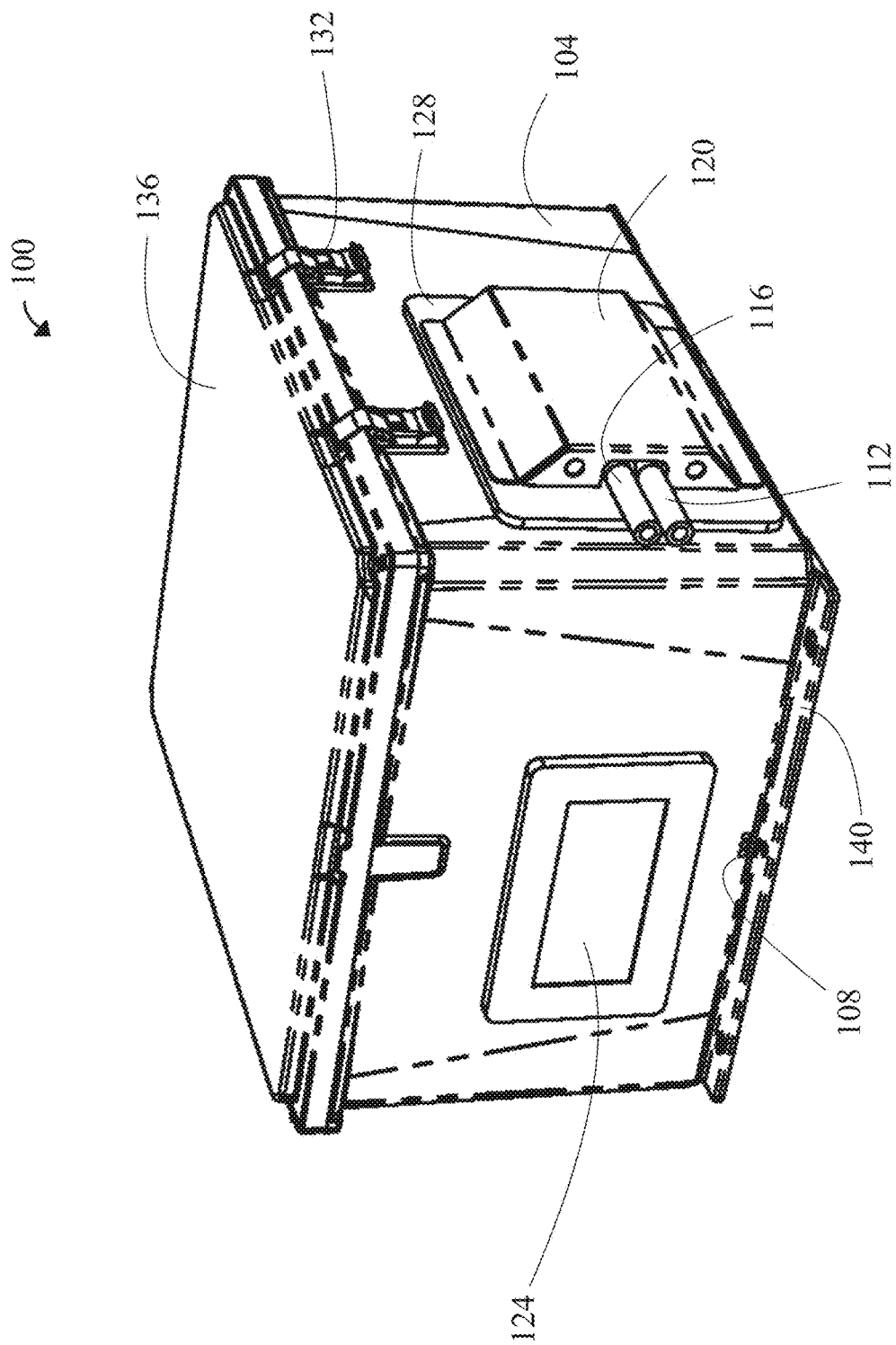
FIG. 1 is an illustration of a front, side, and top view of the exterior of an exemplary embodiment of apparatus.

Referring now to FIG. 1, an exemplary embodiment of an apparatus 100 for image projection is illustrated. Apparatus 100 may include a computing device. Apparatus 100 may include a processor. Processor may include, without limitation, any processor described in this disclosure. Processor may be included in a computing device. Computing device may include any computing device as described in this disclosure, including without limitation a microcontroller, microprocessor, digital signal processor (DSP) and/or system on a chip (SoC) as described in this disclosure. Computing device may include, be included in, and/or communicate with a mobile device such as a mobile telephone or smartphone. Computing device may include a single computing device operating independently, or may include two or more computing device operating in concert, in parallel, sequentially or the like; two or more computing devices may be included together in a single computing device or in two or more computing devices. Computing device may interface or communicate with one or more additional devices as described below in further detail via a network interface device. Network interface device may be utilized for connecting computing device to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network may employ a wired and/or a wireless mode of communication. In general, any network topology may be used. Information (e.g., data, software etc.) may be communicated to and/or from a computer and/or a computing device. Computing device may include but is not limited to, for example, a computing device or cluster of computing devices in a first location and a second computing device or cluster of computing devices in a second location. Computing device may include one or more computing devices dedicated to data storage, security, distribution of traffic for load balancing, and the like. Computing device may distribute one or more computing tasks as described below across a plurality of computing devices of computing device, which may operate in parallel, in series, redundantly, or in any other manner used for distribution of tasks or memory between computing devices. Computing device may be implemented, as a non-limiting example, using a "shared nothing" architecture.

Still referring to FIG. 1, computing device may be designed and/or configured to perform any method, method step, or sequence of method steps in any embodiment described in this disclosure, in any order and with any degree of repetition. For instance, computing device may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Computing device may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

Still referring to FIG. 1, as used in this disclosure, "communicatively connected" means connected by way of a connection, attachment or linkage between two or more relata which allows for reception and/or transmittance of information therebetween. For example, and without limitation, this connection may be wired or wireless, direct or indirect, and between two or more components, circuits, devices, systems, and the like, which allows for reception and/or transmittance of data and/or signal(s) therebetween. Data and/or signals therebetween may include, without limitation, electrical, electromagnetic, magnetic, video, audio, radio and microwave data and/or signals, combinations thereof, and the like, among others. A communicative connection may be achieved, for example and without limitation, through wired or wireless electronic, digital or analog, communication, either directly or by way of one or more intervening devices or components. Further, communicative connection may include electrically coupling or connecting at least an output of one device, component, or circuit to at least an input of another device, component, or circuit. For example, and without limitation, via a bus or other facility for intercommunication between elements of a computing device. Communicative connecting may also include indirect connections via, for example and without limitation, wireless connection, radio communication, low power wide area network, optical communication, magnetic, capacitive, or optical coupling, and the like. In some instances, the terminology "communicatively coupled" may be used in place of communicatively connected in this disclosure.

Still referring to FIG. 1, in some embodiments, apparatus 100 may include a housing 104. In some embodiments, housing 104 may include a hollow structure in a substantially cylindrical shape. In some embodiments, housing 104 may include a hollow structure in a substantially rectangular cylinder shape. In some embodiments, housing 104 may include a polycarbonate housing. In some embodiments, housing 104 may include a housing constructed from a durable material such as plastic, wood, or rubber. In some embodiments, housing 104 may include a sealed structure. In some embodiments, housing 104 may include an airtight and/or waterproof structure.

Still referring to FIG. 1, housing 104 may include a breathable hydrophobic material. As used herein, a "breathable hydrophobic material" is a material that is watertight but not necessarily airtight. Breathable hydrophobic material may include a rigid material. Breathable hydrophobic material may be configured to allow heat and air to exit housing 104 while preventing water from entering housing 104. As used herein, "hydrophobic" describes a material that does not absorb water or allow water to pass through. A hydrophobic material may repel water. In some embodiments, a hydrophobic material may not dissolve in water or in a solution that contains a largely aqueous environment. Examples of breathable hydrophobic materials may include polycarbonate, polytetrafluoroethylene, plastics, metals, acrylics, epoxies, polyethylene, polystyrene, polyvinylchloride, polydimethylsiloxane, polyesters, polyurethanes, fluoropolymers, and the like. A breathable hydrophobic material may include TEFLON produced by The Chemours Company FC, LLC. A breathable hydrophobic material may also include GORE-TEX produced by W, L. Gore & Associates. In some embodiments, a breathable hydrophobic material may be configured to prevent water vapor from entering housing 104. In some embodiments, a breathable hydrophobic material may be configured to allow water vapor to escape housing 104.

Still referring to FIG. 1, in some embodiments, housing 104 may include one or more vents. As used herein, a "vent" is an opening or material through which air may pass. In some embodiments, a vent may include an opening such as a hole or slit. In some embodiments, a vent may include a covering that allows air to pass through but does not allow water to pass through. In some embodiments, housing 104 may include a plurality of vents. In some embodiments, housing 104 may include 1, 2, 3, 4, 5, 6, 7, 8, 9, 10, 15, 20, or more vents.

Still referring to FIG. 1, in some embodiments, apparatus 100 may include one or more weep holes 108. In some embodiments, apparatus 100 may include 1, 2, 3, 4, 5, 6, 7, 8, 9, 10 or more weep holes. In some embodiments, a weep hole 108 may be positioned on a bottom surface of housing 104. In some embodiments, a weep hole 108 may be positioned on the bottom of a side surface of housing 104. In some embodiments, a weep hole 108 may be positioned such that liquid inside housing 104 may exit housing 104 due to gravity.

Still referring to FIG. 1, in some embodiments, apparatus 100 may include a coolant input 112 and/or a coolant output 116. In some embodiments, coolant input 112 and/or coolant output 116 are connected to a cooling device as described further herein. In some embodiments, a coolant input 112 may be configured to, and/or may be connected to a device configured to, transport coolant into a coolant reservoir of coolant system. In some embodiments, a coolant output 116 may be configured to, and/or may be connected to a device configured to, transport coolant from a coolant reservoir of coolant system. In some embodiments, coolant input 112 may transport coolant of a temperature below the average temperature of coolant in a coolant reservoir into the coolant reservoir. In some embodiments, coolant output 116 may transport coolant from coolant reservoir to a device configured to cool coolant. In some embodiments, coolant may be in a closed system such that coolant is removed from coolant reservoir, cooled, then input back into coolant reservoir. In some embodiments, coolant input 112 and coolant output 116 may function to reduce the average temperature of coolant in coolant reservoir. In some embodiments, coolant comprises water. In some embodiments, coolant comprises a water glycol mixture.

Still referring to FIG. 1, in some embodiments, apparatus 100 may include a coolant system housing 120. In some embodiments, coolant system housing 120 may include a hollow structure protruding from housing 104. In some embodiments, coolant system housing 120 may include polycarbonate. In some embodiments, coolant system housing 120 may include a breathable hydrophobic material. In some embodiments, coolant system housing 120 may be affixed to housing 104, such as with an adhesive, a screw, a latch, or the like. In some embodiments, coolant system housing 120 may be affixed to a heat conductive plate 128. In some embodiments, coolant system housing 120 may include a housing in a substantially cylindrical shape, with the base of the cylinder being a trapezoid. In some embodiments, coolant system housing 120 may include one or more openings through which coolant input 112 and/or coolant output 116 may fit. In some embodiments, coolant system housing 120 may house a coolant reservoir, as described further below.

Still referring to FIG. 1, in some embodiments, apparatus 100 may include an image output window 124. In some embodiments, image output window 124 may include a transparent material built into a side of housing 104. In some embodiments, image output window 124 may include a transparent material such as glass, plastic, and the like. Image output window 124 may be positioned in front of an image projection device within housing 104, such that the image projection device may project an image outside of housing 104, through image output window 124. In some embodiments, image output window may have a substantially flat, rectangular shape. Image projection devices are described further herein.

Still referring to FIG. 1, in some embodiments, apparatus 100 may include a heat conductive plate 128. In some embodiments, heat conductive plate 128 may include a heat conductive material, such as copper or aluminum. In some embodiments, heat conductive plate 128 may include aluminum. In some embodiments, heat conductive plate 128 may be affixed to a side of housing 104, such as using an adhesive, a screw, nail, latch, or the like. In some embodiments, heat conductive plate 128 may be affixed to an exterior side surface of housing 104. In some embodiments, heat conductive plate 128 may be affixed to coolant system housing 120. In some embodiments, heat conductive plate 128 may include a substantially thin and flat sheet of heat conductive material. In some embodiments, heat conductive plate 128 may be substantially rectangular. In some embodiments, heat conductive plate 128 may include one or more holes, such that one or more elements of a cooling device may fit in heat conductive plate 128.

Still referring to FIG. 1, in some embodiments, apparatus 100 may include a lid latch 132. In some embodiments, apparatus 100 may include a lid 136. In some embodiments, lid 136 may be removably attached to housing 104 using a plurality of latches including lid latch 132. As used in the current disclosure, a "latch" is a type of mechanical fastener that joins two (or more) objects or surfaces while allowing for their regular separation. In some embodiments, lid latch 132 may be positioned on a side exterior surface of housing 104. In some embodiments, lid latch 132 may be positioned such that it may hold lid 132 in place. A latch typically engages another piece of hardware on the other mounting surface. In some embodiments, lid 136 may include one or more concave elements or grooves such that lid latch 132 may hold lid 136 in place. One portion of lid latch 132 may be mechanically attached to lid 132 while the remaining portion of lid latch 136 may be mechanically attached to a surface of housing 104. In some embodiments, lid 136 may include polycarbonate. In some embodiments, lid 136 may include a breathable hydrophobic material. In some embodiments, lid 136 may be a substantially flat rectangular structure positioned to enclose an opening at the top of housing 104. In some embodiments, lid 136 may be attached to housing 104 by a hinge as described further herein.

Still referring to FIG. 1, in some embodiments, lid 136 may include an indented ledge. As used herein, an "indented ledge" is an indention on a surface which provides a tiered aesthetic. An indented ledge may be used to create a water-tight seal between lid 136 and housing 104. A a rim of the top of housing 104 and/or an interior of lid 136 that overlaps an upper rim of the top of housing 104 may be outfitted with a waterproof gasket. In some embodiments, waterproof gasket may be attached to lid 136 under an indented ledge. A waterproof gasket may be pressed against a rigid surface to create a water-tight seal. Indented ledge may be configured to wrap around the entirety of the top of housing 104. In some embodiments, an indented ledge may include a cut out configured to receive a hook of lid latch 132.

Still referring to FIG. 1, in some embodiments, apparatus 100 may include a mounting bracket 140. In some embodiments, apparatus 100 may include a plurality of mounting brackets, such as 2 mounting brackets. In some embodiments, mounting bracket may include one or more holes and/or rails such that apparatus 100 may be affixed to another object using, for example, a screw. In some embodiments, a mounting bracket may be positioned on a bottom edge of housing 104.

Figure 2:
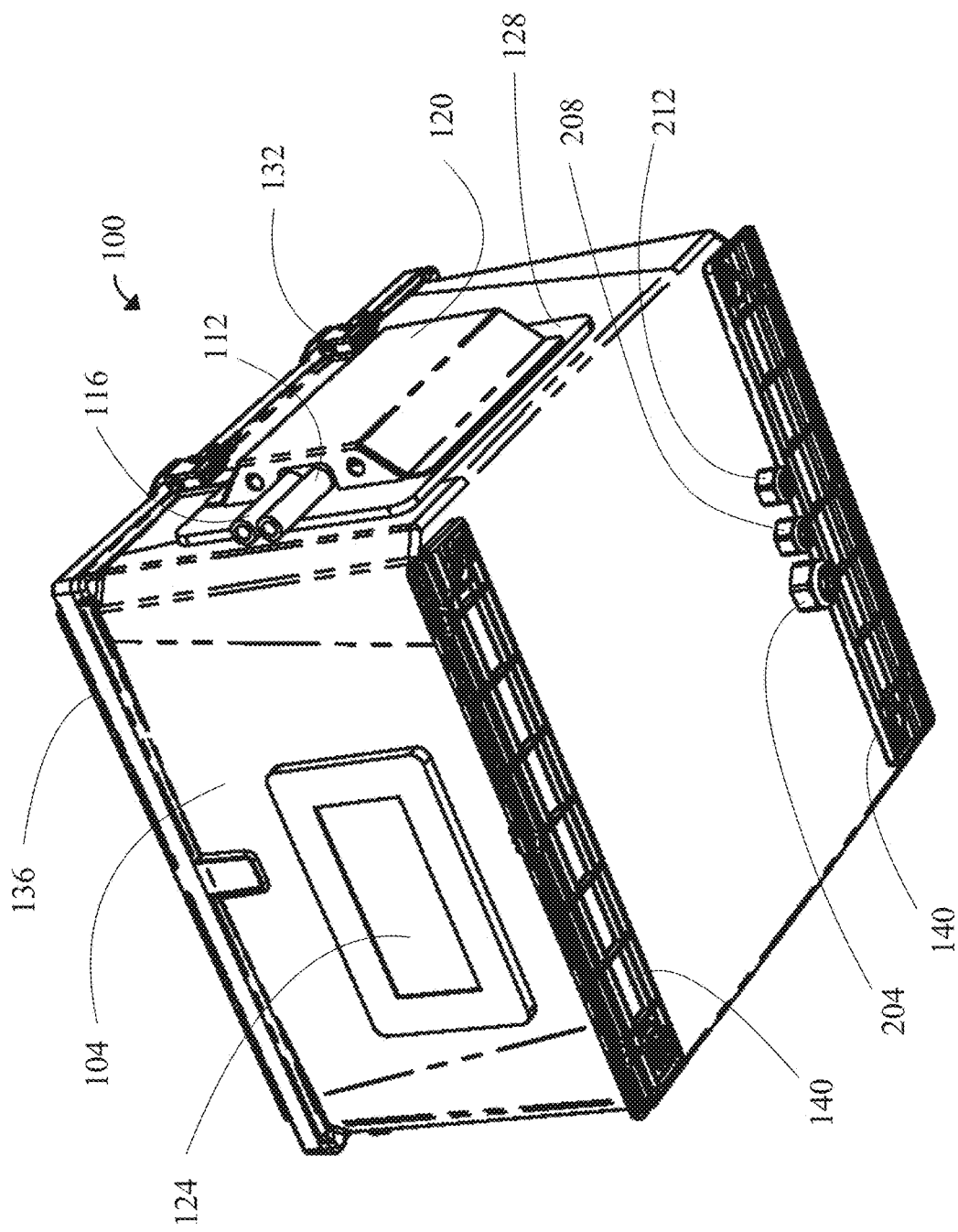
FIG. 2 is an illustration of a front, side, and bottom view of the exterior of an exemplary embodiment of apparatus.

Now referring to FIG. 2, apparatus 100 may include a power input port 204. In some embodiments, power input port 204 may include a port on a bottom exterior surface of housing 104. In some embodiments, power input port 204 may include a port configured to accept power from a cable. In some embodiments, power input port 204 may be connected to, and/or may provide power to, a power supply and/or computing device described herein, such as a digital image projection device, a digital signage player, an I/O assembly, a cooling system, and/or a power supply associated with an item from this list. In some embodiments, power input port 204 may include a 120V AC power input.

Still referring to FIG. 2, apparatus 100 may include a control input port 208. In some embodiments, control input port 208 may include a port on a bottom exterior surface of housing 104. In some embodiments, control input port 208 may include a port configured to accept an input from another device configuring one or more elements of apparatus 100 to turn on and/or turn off. In some embodiments, control input port 208 may be configured to accept such a signal from a cable connected to an external device.

Still referring to FIG. 2, apparatus 100 may include an ethernet port 212. In some embodiments, ethernet port 212 may include a port on a bottom exterior surface of housing 104. In some embodiments, ethernet port 212 may be configured to accept ethernet signals from an external device through an ethernet cable. In some embodiments, ethernet port 212 may transmit ethernet signals to one or more computing devices within housing 104, such as a digital image projection device, a digital signage player, an I/O assembly, and/or a cooling system.

Figure 3:
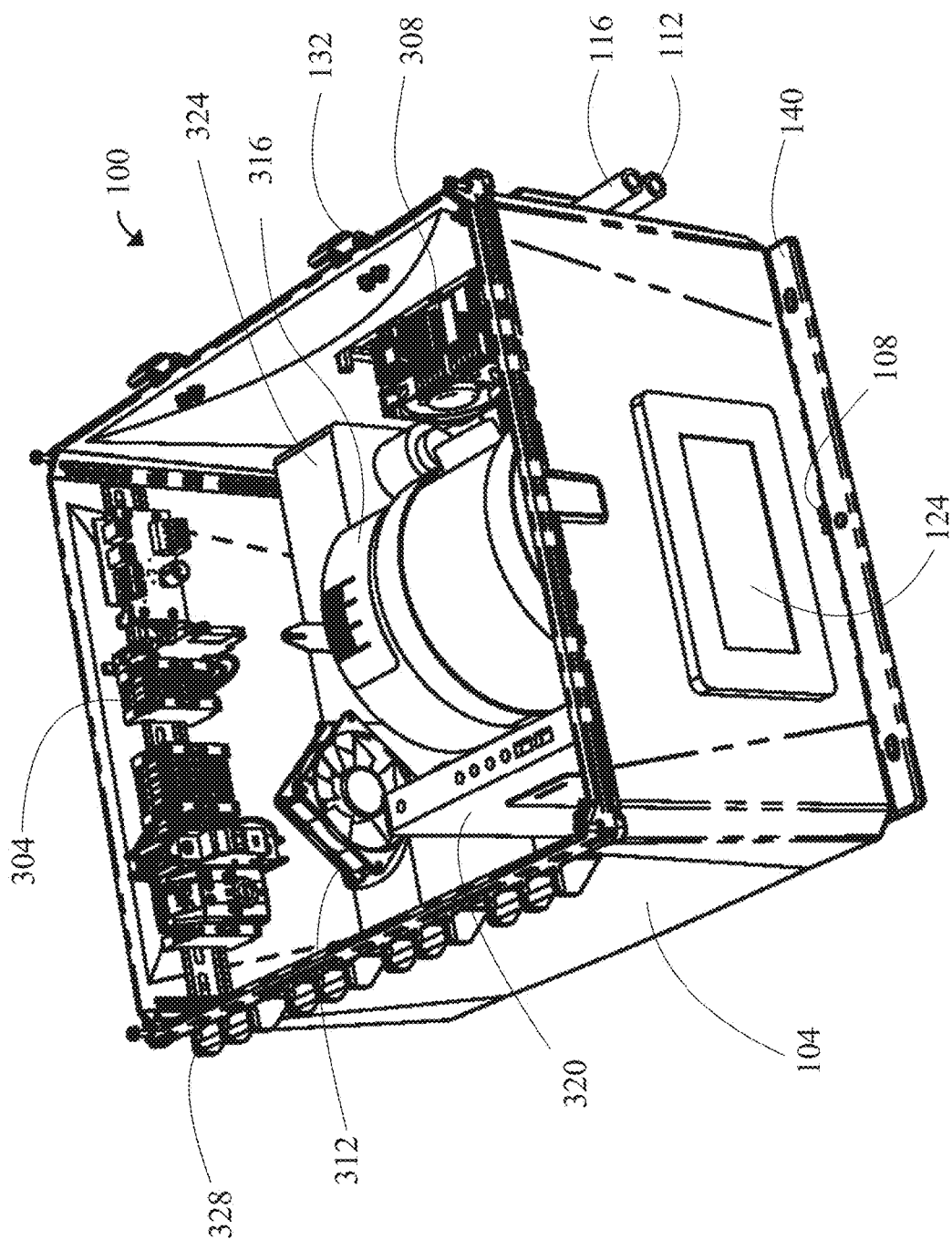
FIG. 3 is an illustration of a front, side, and top view of an exemplary embodiment of apparatus, with the inside visible as though a lid is removed.

Now referring to FIG. 3, in some embodiments, apparatus 100 may include an I/O assembly 304. I/O assembly 304 is further described with respect to FIG. 4.

Still referring to FIG. 3, in some embodiments, apparatus 100 may include a coolant system 308. Coolant system 308 is described further with respect to FIGS. 6-8.

Still referring to FIG. 3, in some embodiments, apparatus 100 may include a mixing fan 312. In some embodiments, mixing fan 312 may include a fan configured to circulate air within housing 104. In some embodiments, mixing fan 312 may prevent large temperature differences from being created between one side of the interior of apparatus 100 and another side of the interior of apparatus 100. In some embodiments, mixing fan 312 may circulate air within housing 104 such that the air in the immediate vicinity of a cooling system and the air in the immediate vicinity of a computing device have closer temperatures than would be the case in a similar apparatus without a mixing fan.

Still referring to FIG. 3, in some embodiments, apparatus 100 may include an image projection device 316. In some embodiments, apparatus 100 may include a digital signage player 320. In some embodiments, image projection device 316 may include a projector configured to project an image and/or video outside of housing 104, through image output window 124. In some embodiments, image projection device 316 may be configured to accept a datum from a digital signage player 320 and project an image as a function of the datum. In some embodiments, digital signage player 320 may include a memory and a processor, the memory including instructions configuring the processor to transmit a datum to image projection device 316. In some embodiments, digital signage player 320 may transmit to image projection device 316 a datum configuring image projection device 316 to start or stop projecting, and/or providing image projection device 316 with image data on an image or video to project. In some embodiments, digital signage player 320 may be configured to accept a datum from an external device. In a non-limiting example, digital signage player may be configured to accept a datum using an ethernet cable connected to ethernet port 212 instructing digital signage player 320 to configure image projection device 316 to project a specific image. In another non-limiting example, digital signage player may be configured to accept a datum using a control cable connected to control port 208 instructing digital signage player 320 to configure image projection device 316 to turn off. In some embodiments, digital signage player 320 may include a digital signage player provided by Samsung, at Samsung Electronics Building, 11, Seocho-daero 74-gil, Seocho District, Seoul, South Korea. In some embodiments, image projection device 316 may include an Epson EV-110 projector provided by Epson America at 3131 Katella Avenue, Los Alamitos, CA 90720.

Still referring to FIG. 3, in some embodiments, apparatus 100 may include a digital projection device power supply 324. In some embodiments, digital projection device power supply 324 may include a power supply configured to provide power to digital projection device 316. In some embodiments, digital projection device power supply 324 may be configured to accept power from an external power source through power input port 204.

Still referring to FIG. 3, in some embodiments, apparatus 100 may include a hinge 328. In some embodiments, hinge 328 may attach lid 136 to housing 104 such that the inside of housing 104 may be opened.

Figure 4:
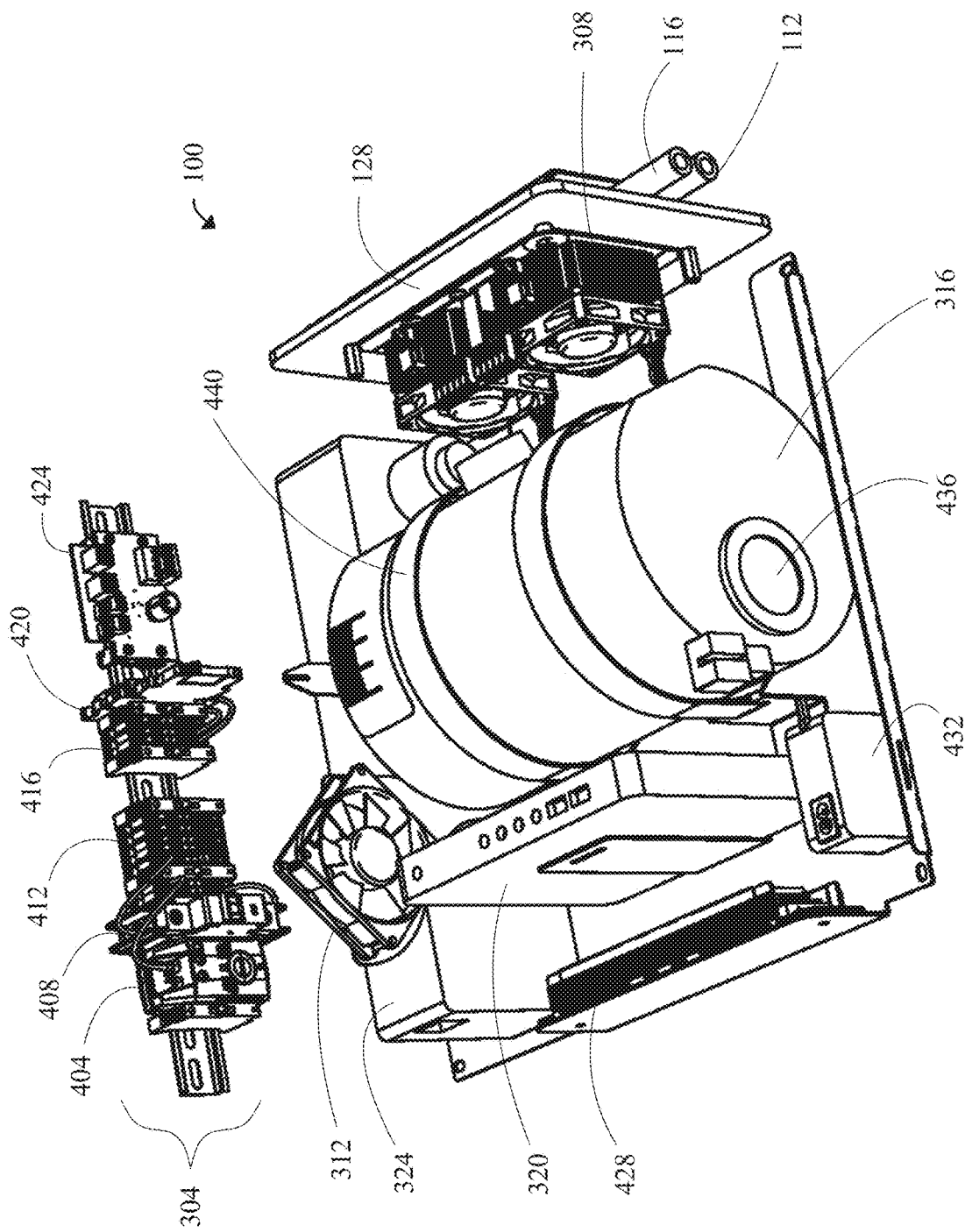
FIG. 4 is an illustration of a front, side, and top view of the interior of an exemplary embodiment of apparatus, wherein certain elements of apparatus are separated such that they may be more easily viewed.

Now referring to FIG. 4, in some embodiments, apparatus 100 may include an input/output (I/O) assembly 304. In some embodiments, I/O assembly 304 may include one or more of a thermostat 404, a circuit breaker 408, a power input terminal 412, a control input terminal 416, a control relay 420, and a controller 424. In some embodiments, thermostat 404 may include a thermometer configured to detect the temperature and output a temperature datum to controller 424. In some embodiments, controller 424 may include a computing device including a processor and a memory, the memory containing instructions configuring the processor to perform one or more of the following functions: request a temperature datum from thermostat 404, receive a temperature datum from thermostat 404, determine a cooling system control datum as a function of the temperature datum, and transmit the cooling device control datum to cooling system 308. In some embodiments, controller 424 may be configured to determine a cooling system control datum in order to maintain temperature of apparatus 100 within a certain range. In a non-limiting example, controller 424 may receive a temperature datum from thermostat 404, controller 424 may compare temperature datum to a threshold, and if the temperature datum is above the threshold, may increase the activity of cooling system 308.

Still referring to FIG. 4, in some embodiments, circuit breaker 408 may protect an electrical circuit, such as an electrical circuit in I/O assembly 304, from damage due to an electric current stronger than the electrical circuit was designed for. In some embodiments, circuit breaker 408 may interrupt current flow in the event of an electric current stronger than a threshold. In some embodiments, circuit breaker 408 may include a 5 Amp circuit breaker.

Still referring to FIG. 4, in some embodiments, power input terminal 412 may be configured to accept power from a power supply, and distribute that power to a plurality of electric devices in apparatus 100. In some embodiments, power input terminal 412 may accept power from an external device using a cable connected to apparatus 100 through power input port 204. In some embodiments, power input terminal 412 may be configured to distribute power to, for example, thermostat 404, controller relay 420, controller 424, digital projection device power supply 324, mixing fan 312, digital projection device 316, digital signage player 320, cooling system 308, cooling system power supply 428, and/or digital signage player power supply 432. Power input terminal 412 may include an AC power input terminal or a DC power input terminal. Power input terminal 412 may include a mains electricity power input terminal. Power input terminal may include a power input terminal configured to receive power from a battery, photovoltaic cell, generator, and the like. In some embodiments, power input terminal 412 may include a 120V AC power input terminal.

Still referring to FIG. 4, in some embodiments, control input terminal 416 and control relay 420 may be configured to accept a control datum from an external device connected through control port 208 and transmit control data to a plurality of electric devices in apparatus 100. In some embodiments, control input terminal 416 and control relay 420 may be configured to distribute control data to, for example, thermostat 404, controller relay 420, controller 424, digital projection device power supply 324, mixing fan 312, digital projection device 316, digital signage player 320, cooling system 308, cooling system power supply 428, and/or digital signage player power supply 432. In some embodiments, control data transmitted using control input terminal 416 may regulate the activity of a receiving device.

Still referring to FIG. 4, in some embodiments, apparatus 100 may include a cooling system power supply 428. In some embodiments, cooling system power supply 428 may accept power from power input terminal 412, or an external power source connected to apparatus 100 through power input port 204. In some embodiments, cooling system power supply 428 may supply power to cooling system 308.

Still referring to FIG. 4, in some embodiments, apparatus 100 may include a digital signage power supply 432. In some embodiments, digital signage power supply 432 may accept power from power input terminal 412, or an external power source connected to apparatus 100 through power input port 204. In some embodiments, digital signage power supply 432 may supply power to digital signage player 320.

Still referring to FIG. 4, in some embodiments, digital projection device 316 may include a projector image port 436. In some embodiments, digital projection device 316 may project an image through projector image port 436. In some embodiments, projector image port 436 may be positioned relative to image output window 124 such that an image projected by digital projection device 316 may exit through projector image port 436 and image output window 124.

Still referring to FIG. 4, in some embodiments, apparatus 100 may include a projector stabilization element 440. In some embodiments, projector stabilization element 440 may hold digital projection device 316 in place such that images projected by digital projection device 316 are projected in a desired direction. In some embodiments, projector stabilization element 440 may include one or more straps affixing digital projection device 316 to a bottom interior surface of housing 104.

Figure 5:
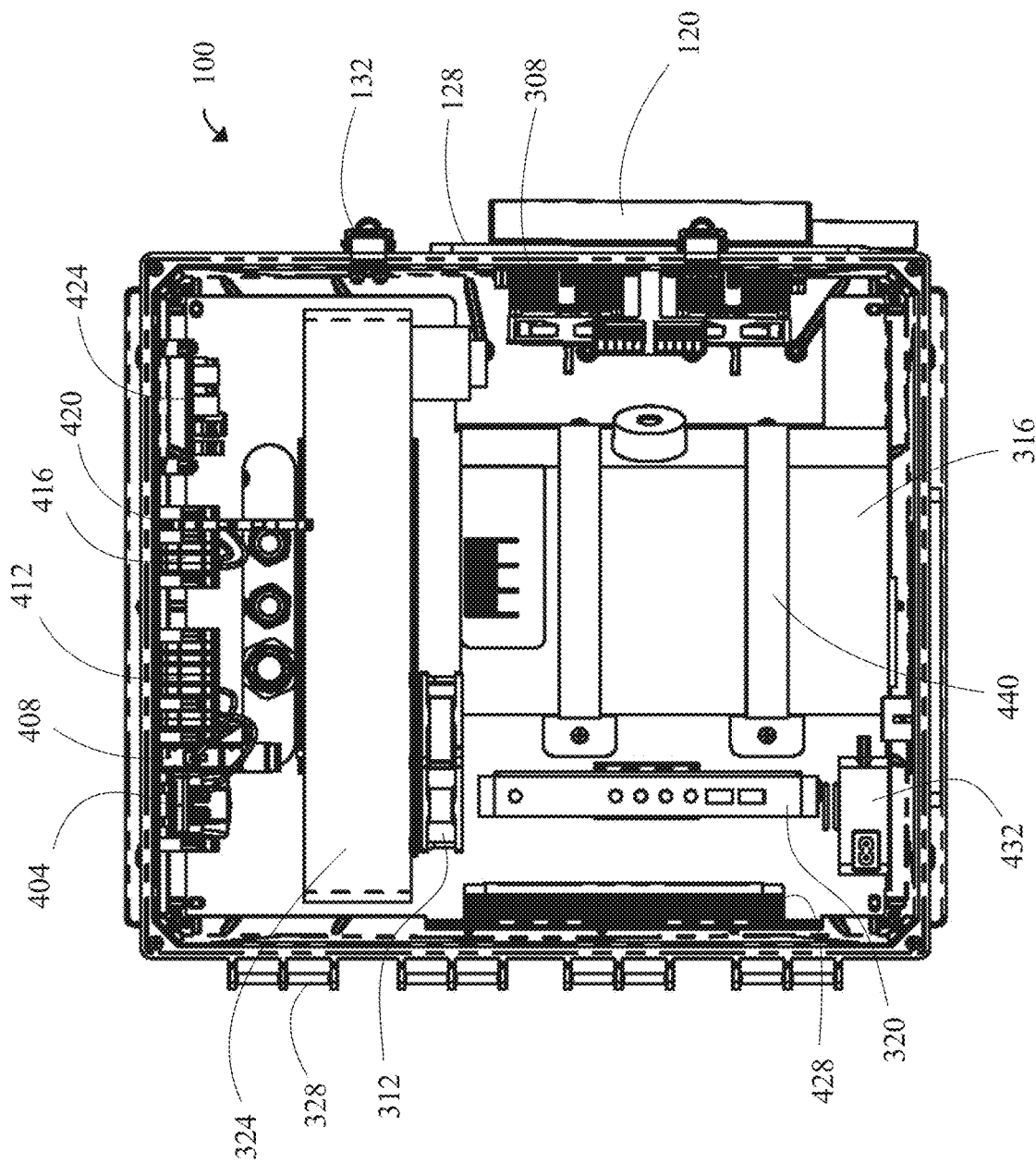
FIG. 5 is an illustration of a top view of the interior of an exemplary embodiment of apparatus.

Now referring to FIG. 5, a top-down view of an exemplary embodiment of apparatus 100 is displayed. In some embodiments, housing 104 may include a substantially rectangular cylindrical shape such that it has a bottom, 4 sides, and a lid. In some embodiments, digital image projection device 316 may be positioned such that it projects images out of the front of apparatus 100 (the bottom of FIG. 5) such as through an image output window 124 on the front of apparatus 100. In some embodiments, digital image projection device 316 may be affixed to a bottom interior surface of housing 104. In some embodiments, digital signage player 320 may be affixed to a bottom interior surface of housing 104. In some embodiments, digital signage power supply 432 may be affixed to a side interior surface of housing 104. In some embodiments, cooling system power supply 432 may be affixed to a side interior surface opposite cooling system 308. In some embodiments, digital signage power supply 432 may be affixed to a front interior surface of housing 104. In some embodiments, digital projection device power supply 324 may be affixed to a bottom interior surface of housing 104. In some embodiments, digital projection device power supply 324 may be positioned behind digital image projection device 316. In some embodiments, I/O assembly may be affixed to a back interior surface of housing 104. In some embodiments, cooling system 308 may be affixed to a side of housing 104. In some embodiments, cooling system 308 may be positioned such that a fan and heat exchanger of cooling system 308 may be inside housing 104 and coolant input 112 and coolant output 116 are outside housing 104.

Figure 6:
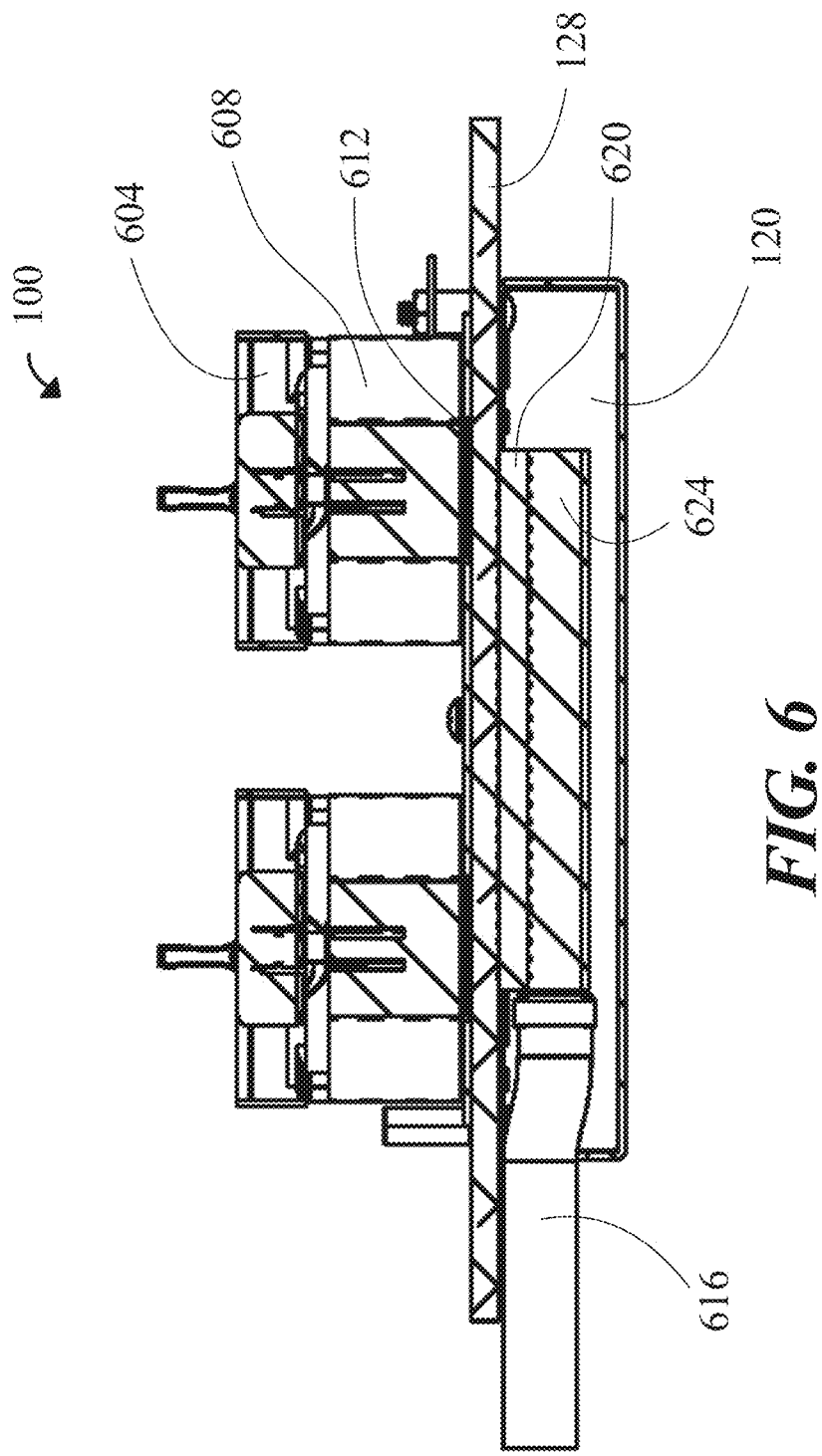
FIG. 6 is an illustration of a side view of an exemplary embodiment of cooling system.

Now referring to FIG. 6, apparatus 100 may include a cooling system 308. Cooling system 308 may extract waste heat from elements of apparatus 100 such as I/O assembly 304, digital image projection device 316, digital signage player 320, and the like. Cooling system 308 may include one or more surfaces composed at least in part of heat-conductive materials such as aluminum, such as in a heat exchanger. Cooling system 308 may use a combination of conduction, convection, and/or other methods to cool such heat-conductive material, which may in turn remove waste heat from apparatus 100. Such methods may include, without limitation, circulation of cooling liquids and/or heat pumps between heated surfaces and relatively cold reservoirs which may include systems of cooling vanes, fans, or the like.

Still referring to FIG. 6, in some embodiments, cooling system 308 may include fan 604. Fan 604 may include a fan configured to blow air from the inside of housing 104 into finned heat exchanger 608. Fan 608 may blow air in the direction of heat conductive plate 128. In some embodiments, activity of fan 604 may be regulated by controller 424. In some embodiments, cooling system 308 may include a plurality of fans 604. In some embodiments, cooling system 308 may include 2 fans 604.

Still referring to FIG. 6, in some embodiments, cooling system 308 may include heat exchanger 608. Heat exchanger 608 may allow for transfer of heat between air inside housing 104 and a heat conductive material, such as aluminum or copper. In some embodiments, heat exchanger may include a high surface area of a heat conductive material. In some embodiments, heat exchanger may include one or more plates, fins, tubes, or the like, configured to provide a high surface area between heat conductive material and air. In some embodiments, heat exchanger 608 may be configured such that air blown into heat exchanger 608 may pass over one or more heat conductive material surfaces. In some embodiments, a heat conductive material is aluminum. In some embodiments, heat exchanger 608 may include a plurality of aluminum fins. In some embodiments, cooling system 308 may include a plurality of heat exchangers 608. In some embodiments, cooling system 308 may include 2 heat exchangers 608.

Still referring to FIG. 6, in some embodiments, cooling system 308 may include a Peltier module 612. In some embodiments, Peltier module 612 may use the Peltier effect to transfer heat from one side of Peltier module 612 to the other. In some embodiments, the Peltier effect may cause a cooling of a first junction and a heating of a second junction where an electric circuit is passed through a circuit including different conductors. In some embodiments, a Peltier module may include an electric circuit, wherein the circuit passes through several junctions between alternating conductive materials, each arranged such that the heated side faces a first direction, and the cooled side faces a second direction. In some embodiments, many such junctions may be arranged such that the heated junctions together approximate a heated surface and the cooled junctions together approximate a cooled surface. In some embodiments, Peltier module 612 may include such a heated surface and cooled surface. In some embodiments, Peltier module 612 may be positioned such that one side of Peltier module 612 faces heat exchanger 608 and/or the interior of housing 104 and the other side of Peltier module 608 faces coolant reservoir and/or the outside of housing 104. In some embodiments, Peltier module 612 may be configured to transfer heat in the direction from the inside of housing 104 to the outside of housing 104. In some embodiments, cooling system 308 may include a plurality of Peltier modules 612. In some embodiments, cooling system 308 may include 2 Peltier modules 612.

Still referring to FIG. 6, in some embodiments, cooling system 308 may include coolant hoses 616. In some embodiments, coolant hoses 616 may include coolant input 112 and coolant output 116. Coolant input 112 and coolant output 116 are described further with reference to FIG. 1.

Still referring to FIG. 6, in some embodiments, cooling system 308 may include a heat conductive spacer 620. In some embodiments, heat conductive spacer 620 may include a heat conductive material, such as aluminum or copper. In some embodiments, heat conductive spacer 620 may include aluminum. In some embodiments, heat conductive spacer 620 may conduct heat from Peltier module to cooling pad 624.

Still referring to FIG. 6, in some embodiments, cooling system 308 may include a cooling pad 624. As used herein, a "cooling pad" is an element of a cooling system that absorbs heat or transfers heat away from the interior of a housing. In some embodiments, cooling pad 624 may absorb heat from one or more elements of cooling system 308 closer to the interior of housing 104 than cooling pad 624.

Still referring to FIG. 6, in some embodiments, cooling pad 624 may include a coolant reservoir. In some embodiments, coolant reservoir may include a coolant. In some embodiments, a coolant may include water. In some embodiments, a coolant may include a mixture of water and glycol. As described with reference to FIG. 1, coolant may be added to and/or removed from coolant reservoir using coolant input 112 and coolant output 116. In some embodiments, the net effect of adding and removing coolant is to reduce the average temperature of coolant in coolant reservoir. In some embodiments, cooling pad 624 may include a water block heat exchanger.

Still referring to FIG. 6, in some embodiments, a cooling pad may include a heat exchanger, magnetic refrigeration system, heat pipe, and the like. In some embodiments, a cooling pad transfers heat to an external heat sink, such as an external coolant reservoir.

Still referring to FIG. 6, in some embodiments, cooling system 308 may include a magnetic refrigeration system. Apparatus 100 may interface with a heat conductor, which may include without limitation any substance, object, and/or system to transfer heat away from device and to a cooled refrigeration material. Refrigeration material may include any suitable material for absorbing and transporting heat through one or more conduits; conduits may include without limitation pipes, tubes, heat pipes, or the like. Refrigeration material may provide heat to a magnetic material such as without limitation $Gd_5(Si_xGe_{1-x})_4$, $La(Fe_xSi_{1-x})_{13}H_x$ and/or $MnFeP_{1-x}As_x$ alloys, $Ni_2Mn-X$ alloys where X may include Ga, Co, In, Al, and/or Sb, and/or any other ferromagnetic material. Refrigeration material may be thermally isolated from magnetic material during some adiabatic phases of magnetic refrigeration and allowed to contact magnetic material during other phases. Isolation may be achieved by cessation of flow using one or more valves or the like. Magnetic material may similarly be connected to one or more cooling sources such as fans, conductive vanes, or the like; connection maybe severed or minimized for adiabatic phases of magnetic refrigeration process as described in further detail with respect to FIG. 13.

Still referring to FIG. 6, in some embodiments, cooling system 308 may include a heat pipe cooling system. As used in this disclosure, a "heat pipe cooling system" is a system that utilizes one or more heat pipes to transfer heat away from apparatus 100 and dissipate transferred heat into surrounding environment, wherein the heat pipe is a passive heat transfer device that uses a sealed, evacuated tube filled with a working fluid to transfer heat from one location to another. In a non-limiting example, heat pipe cooling system may include one or more heat pipes that are mounted such that they are in contact with a heat conductive material on the interior of apparatus 100. In some embodiments, as apparatus 100 operates, heat may be generated within apparatus 100, and such heat may be transferred to one or more heat pipes via conduction. Such heat dissipation of heat pipe cooling system may be used to regulate the temperature of apparatus 100.

Figure 7:
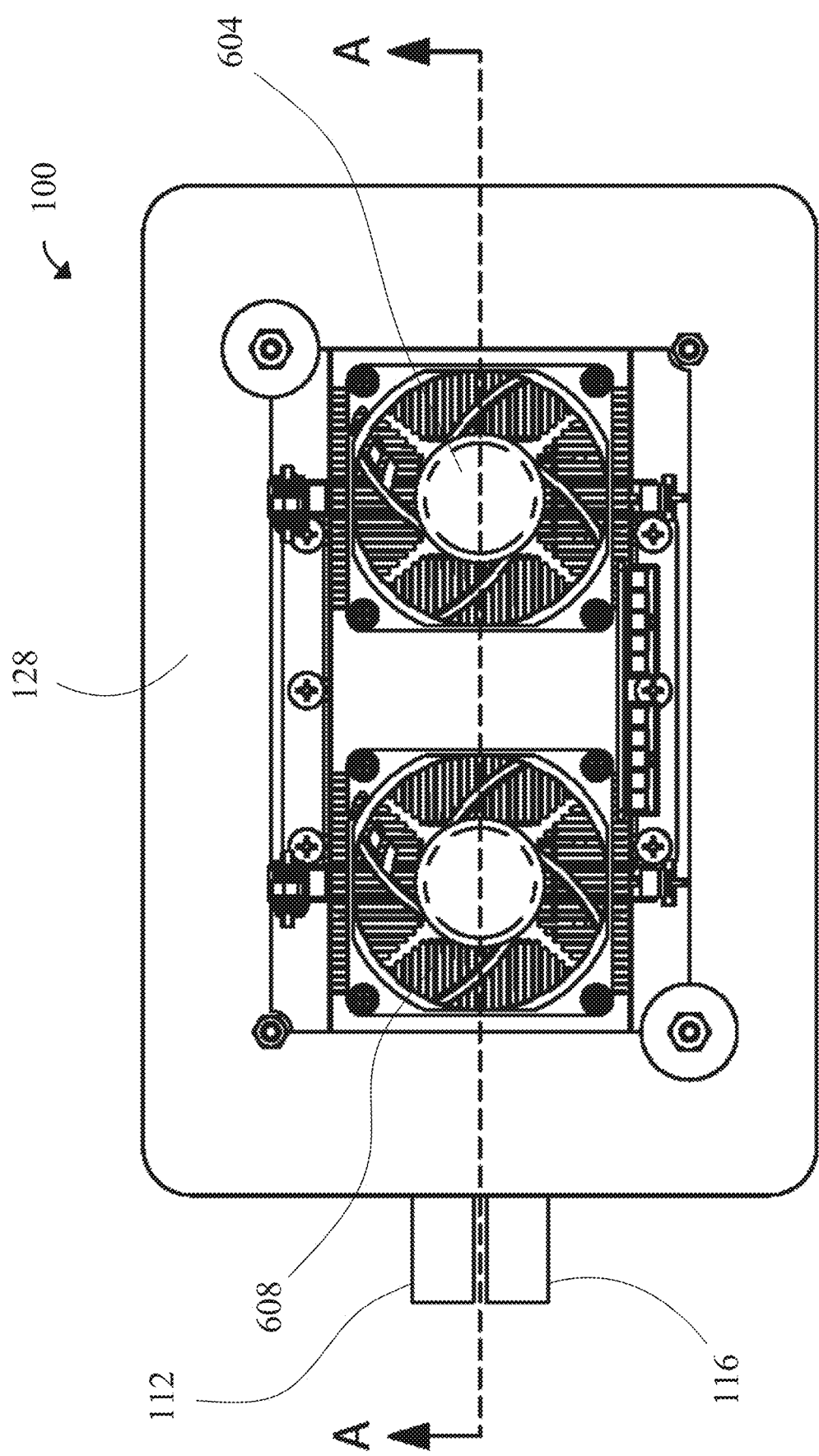
FIG. 7 is an illustration of a top view of an exemplary embodiment of cooling system.

Now referring to FIG. 7, another view of an exemplary embodiment of cooling system 308 is illustrated.

Figure 8:
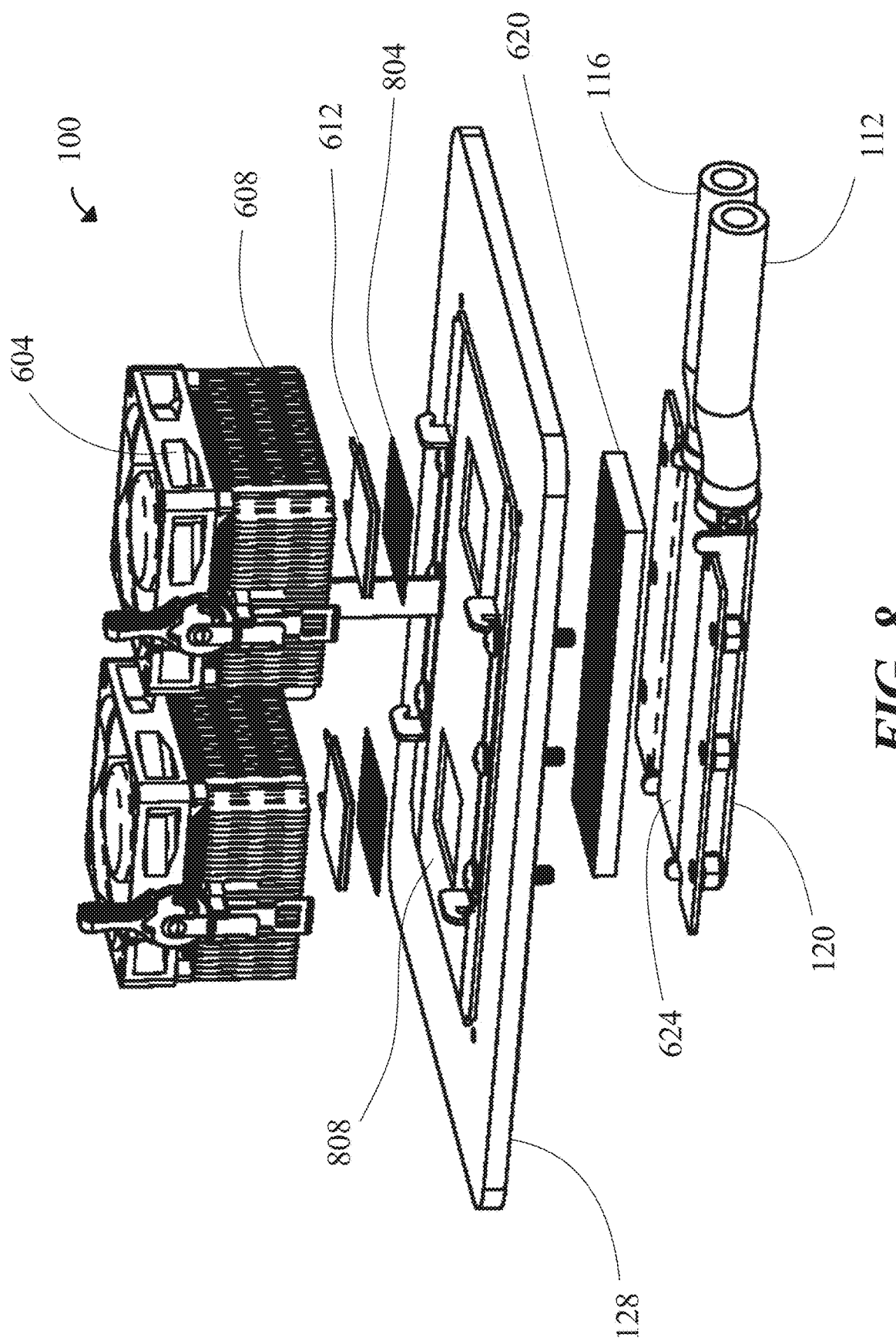
FIG. 8 is an illustration of a view of an exemplary embodiment of cooling system, wherein certain elements of cooling system are separated such that they may be more easily viewed.

Now referring to FIG. 8, in some embodiments, cooling system 308 may include thermal grease 804, positioned between Peltier module 612 and heat conductive spacer 620. In some embodiments, thermal grease 804 may conduct heat efficiently between Peltier module 612 and heat conductive spacer 620.

Still referring to FIG. 8, in some embodiments, cooling system 308 may include insulator 808, positioned between Peltier module 612 and heat conductive plate 128. In some embodiments, insulator 808 may include a material that does not efficiently conduct heat. In some embodiments, insulator 808 may include insulating foam. In some embodiments, insulator 808 may include a hole in which Peltier module 612 may fit, such that Peltier module 612 may transfer heat from one side of insulator 808 to the other, but heat is not efficiently transferred sideways from Peltier module 612.

Figure 9:
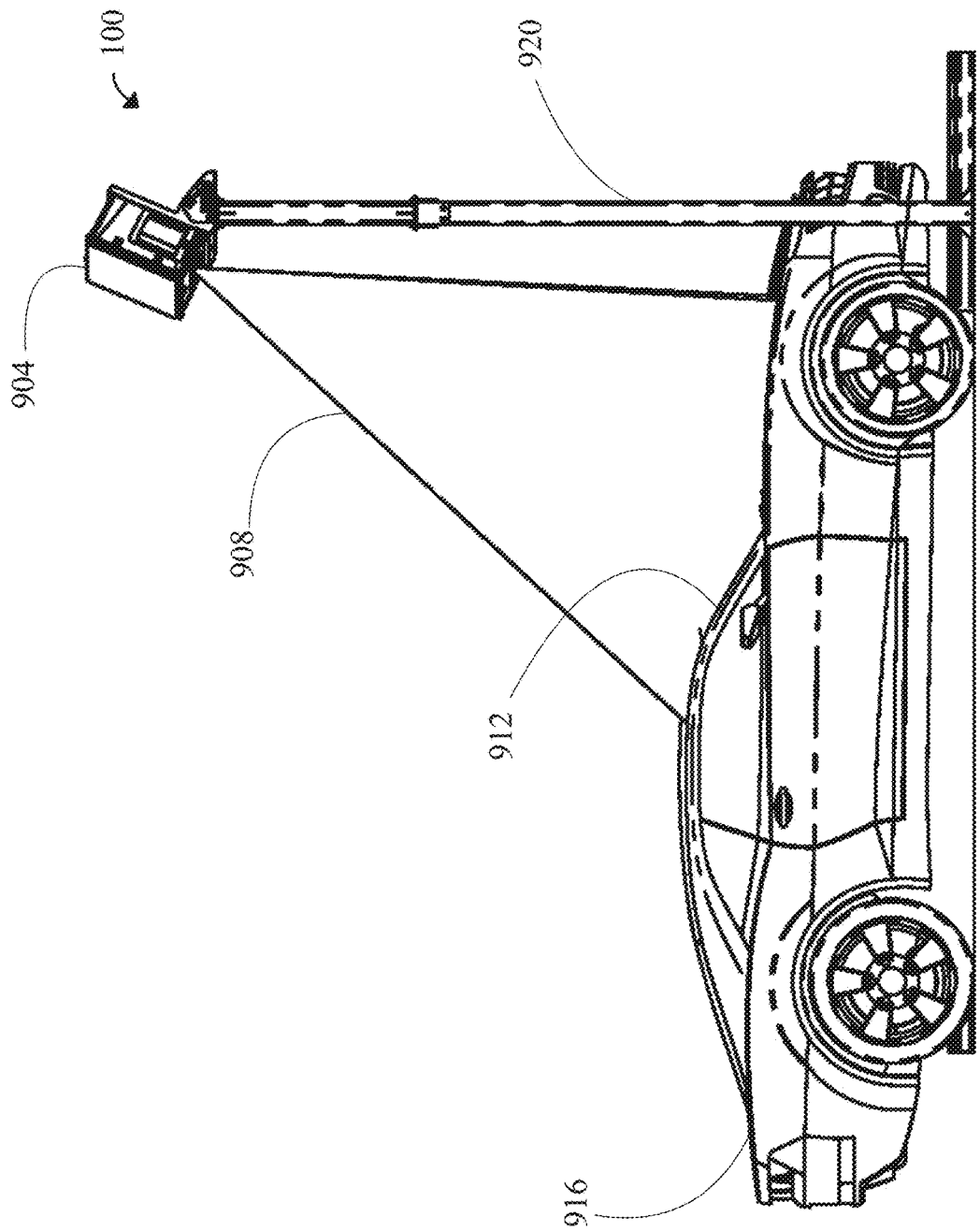
FIG. 9 is an illustration of an exemplary embodiment of apparatus projecting an image towards a vehicle.

Now referring to FIG. 9, in some embodiments, apparatus 100 may project an image onto foam on a windshield of a vehicle while the vehicle is in a carwash. In some embodiments, apparatus 100 may project projection field 908 from projector enclosure 904. As used herein, a "projection field" is a volume of space through which an image is projected by an image projection device. In some embodiments, a windshield 912 of a vehicle 916 is within projection field 908. In some embodiments, foam on windshield 912 is within projection field 908. In some embodiments, a window of vehicle 916, such as a side window, rear window, windshield, or skylight, is within projection field 908. In some embodiments, projector enclosure 904 is positioned on structural element 920. Structural element 920 may include, in non-limiting examples, an arch, pole, beam, wire, or the like in a car wash. In some embodiments, projector enclosure 904 is positioned above vehicle 916. In some embodiments, projector enclosure 904 is positioned and oriented such that an image is projected "flat" onto windshield 912 and/or foam on windshield 912 (as in, projector enclosure 904 may be positioned such that the image is not deformed by differences in the distance between a first side of windshield 912 and projector enclosure 904 and a second side of windshield 912 and projector enclosure 904.

Still referring to FIG. 9, in some embodiments, a projector may project an image, video, and the like onto foam on a vehicle windshield. In non-limiting examples, a projector may project a description of one or more car wash processes that are ongoing, a video to entertain a user in vehicle 916, an ad, and the like.

Still referring to FIG. 9, in some embodiments, projector enclosure 904 may be mobile. In some embodiments, structural element 920 may move and/or reorient projector enclosure 904 such that an image is projected onto a window and/or foam on a window of vehicle 916. In some embodiments, a machine learning algorithm may be used to determine where to position and orient projector enclosure 904. In some embodiments, projector enclosure 904 may be positioned and/or oriented as a function of a positioning datum. In some embodiments, a sensor, such as a camera, may detect the type of a vehicle, the position of the vehicle, and/or the density of the foam on the windshield. In some embodiments, the sensor may transmit this data to a processor, and the processor may input this data into a positioning machine learning algorithm. A positioning machine learning algorithm may output a positioning datum to the processor, and the processor may determine a target position and orientation as a function of the positioning datum. A positioning machine learning algorithm may be trained using supervised learning on datasets including vehicle types, positions, and levels of foam on the windshield, associated with optimal projector enclosure positions. In some embodiments, such a dataset may include data on historical projector enclosure positions chosen by humans manually targeting foam on vehicle windshields. In another example, a positioning machine learning algorithm may be trained using reinforcement learning. Such an algorithm may select a position and orientation, and may receive feedback in the form of a cost function from a human based on how effectively foam on the windshield was targeted.

Still referring to FIG. 9, in some embodiments, a positioning datum may be determined using a machine vision system. As a non-limiting example, apparatus 100 may include a camera, and a machine vision algorithm may be used to detect foam on a window of a vehicle; projector enclosure 904 may be repositioned and reoriented as a function of a datum produced by a machine vision algorithm.

Still referring to FIG. 9, in some embodiments, apparatus 100 may include at least a camera. As used in this disclosure, a "camera" is a device that is configured to sense electromagnetic radiation, such as without limitation visible light, and generate an image representing the electromagnetic radiation. In some cases, a camera may include one or more optics. Exemplary non-limiting optics include spherical lenses, aspherical lenses, reflectors, polarizers, filters, windows, aperture stops, and the like. In some cases, at least a camera may include an image sensor. Exemplary non-limiting image sensors include digital image sensors, such as without limitation charge-coupled device (CCD) sensors and complimentary metal-oxide-semiconductor (CMOS) sensors, chemical image sensors, and analog image sensors, such as without limitation film. In some cases, a camera may be sensitive within a non-visible range of electromagnetic radiation, such as without limitation infrared. As used in this disclosure, "image data" is information representing at least a physical scene, space, and/or object. In some cases, image data may be generated by a camera. "Image data" may be used interchangeably through this disclosure with "image," where image is used as a noun. An image may be optical, such as without limitation where at least an optic is used to generate an image of an object. An image may be material, such as without limitation when film is used to capture an image. An image may be digital, such as without limitation when represented as a bitmap. Alternatively, an image may be comprised of any media capable of representing a physical scene, space, and/or object. Alternatively, where "image" is used as a verb, in this disclosure, it refers to generation and/or formation of an image.

Still referring to FIG. 9, in some embodiments, apparatus 100 may include a machine vision system. In some embodiments, a machine vision system may include at least a camera. A machine vision system may use images, such as images from at least a camera, to make a determination about a scene, space, and/or object. For example, in some cases a machine vision system may be used for world modeling or registration of objects within a space. In some cases, registration may include image processing, such as without limitation object recognition, feature detection, edge/corner detection, and the like. Non-limiting example of feature detection may include scale invariant feature transform (SIFT), Canny edge detection, Shi Tomasi corner detection, and the like. In some cases, registration may include one or more transformations to orient a camera frame (or an image or video stream) relative a three-dimensional coordinate system; exemplary transformations include without limitation homography transforms and affine transforms. In an embodiment, registration of first frame to a coordinate system may be verified and/or corrected using object identification and/or computer vision, as described above. For instance, and without limitation, an initial registration to two dimensions, represented for instance as registration to the x and y coordinates, may be performed using a two-dimensional projection of points in three dimensions onto a first frame, however. A third dimension of registration, representing depth and/or a z axis, may be detected by comparison of two frames; for instance, where first frame includes a pair of frames captured using a pair of cameras (e.g., stereoscopic camera also referred to in this disclosure as stereo-camera), image recognition and/or edge detection software may be used to detect a pair of stereoscopic views of images of an object; two stereoscopic views may be compared to derive z-axis values of points on object permitting, for instance, derivation of further z-axis points within and/or around the object using interpolation. This may be repeated with multiple objects in field of view, including without limitation environmental features of interest identified by object classifier and/or indicated by an operator. In an embodiment, x and y axes may be chosen to span a plane common to two cameras used for stereoscopic image capturing and/or an xy plane of a first frame; a result, x and y translational components and $\phi$ may be pre-populated in translational and rotational matrices, for affine transformation of coordinates of object, also as described above. Initial x and y coordinates and/or guesses at transformational matrices may alternatively or additionally be performed between first frame and second frame, as described above. For each point of a plurality of points on object and/or edge and/or edges of object as described above, x and y coordinates of a first stereoscopic frame may be populated, with an initial estimate of z coordinates based, for instance, on assumptions about object, such as an assumption that ground is substantially parallel to an xy plane as selected above. Z coordinates, and/or x, y, and z coordinates, registered using image capturing and/or object identification processes as described above may then be compared to coordinates predicted using initial guess at transformation matrices; an error function may be computed using by comparing the two sets of points, and new x, y, and/or z coordinates, may be iteratively estimated and compared until the error function drops below a threshold level. In some cases, a machine vision system may use a classifier, such as any classifier described throughout this disclosure.

Still referring to FIG. 9, an exemplary machine vision camera is an OpenMV Cam H7 from OpenMV, LLC of Atlanta, Georgia, U.S.A. OpenMV Cam comprises a small, low power, microcontroller which allows execution of machine vision applications. OpenMV Cam comprises an ARM Cortex M7 processor and a 640×480 image sensor operating at a frame rate up to 150 fps. OpenMV Cam may be programmed with Python using a Remote Python/Procedure Call (RPC) library. OpenMV CAM may be used to operate image classification and segmentation models, such as without limitation by way of TensorFlow Lite; detection motion, for example by way of frame differencing algorithms; marker detection, for example blob detection; object detection, for example face detection; eye tracking; person detection, for example by way of a trained machine learning model; camera motion detection, for example by way of optical flow detection; code (barcode) detection and decoding; image capture; and video recording.

Figure 10:
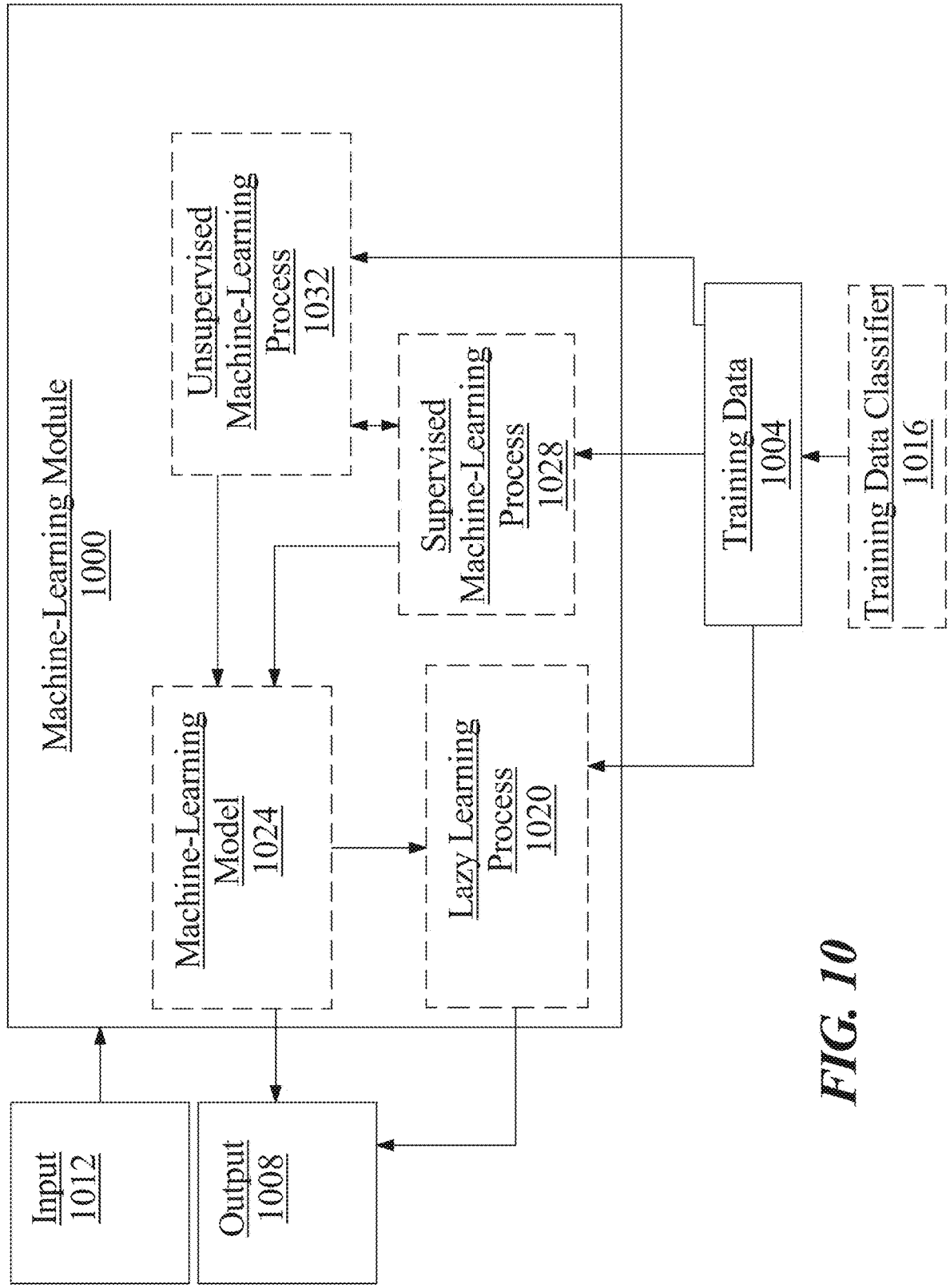
FIG. 10 is a diagram of an exemplary machine learning module.

Referring now to FIG. 10, an exemplary embodiment of a machine-learning module 1000 that may perform one or more machine-learning processes as described in this disclosure is illustrated. Machine-learning module may perform determinations, classification, and/or analysis steps, methods, processes, or the like as described in this disclosure using machine learning processes. A "machine learning process," as used in this disclosure, is a process that automatedly uses training data 1004 to generate an algorithm that will be performed by a computing device/module to produce outputs 1008 given data provided as inputs 1012; this is in contrast to a non-machine learning software program where the commands to be executed are determined in advance by a user and written in a programming language.

Still referring to FIG. 10, "training data," as used herein, is data containing correlations that a machine-learning process may use to model relationships between two or more categories of data elements. For instance, and without limitation, training data 1004 may include a plurality of data entries, each entry representing a set of data elements that were recorded, received, and/or generated together; data elements may be correlated by shared existence in a given data entry, by proximity in a given data entry, or the like. Multiple data entries in training data 1004 may evince one or more trends in correlations between categories of data elements; for instance, and without limitation, a higher value of a first data element belonging to a first category of data element may tend to correlate to a higher value of a second data element belonging to a second category of data element, indicating a possible proportional or other mathematical relationship linking values belonging to the two categories. Multiple categories of data elements may be related in training data 1004 according to various correlations; correlations may indicate causative and/or predictive links between categories of data elements, which may be modeled as relationships such as mathematical relationships by machine-learning processes as described in further detail below. Training data 1004 may be formatted and/or organized by categories of data elements, for instance by associating data elements with one or more descriptors corresponding to categories of data elements. As a non-limiting example, training data 1004 may include data entered in standardized forms by persons or processes, such that entry of a given data element in a given field in a form may be mapped to one or more descriptors of categories. Elements in training data 1004 may be linked to descriptors of categories by tags, tokens, or other data elements; for instance, and without limitation, training data 1004 may be provided in fixed-length formats, formats linking positions of data to categories such as comma-separated value (CSV) formats and/or self-describing formats such as extensible markup language (XML), JavaScript Object Notation (JSON), or the like, enabling processes or devices to detect categories of data.

Alternatively or additionally, and continuing to refer to FIG. 10, training data 1004 may include one or more elements that are not categorized; that is, training data 1004 may not be formatted or contain descriptors for some elements of data. Machine-learning algorithms and/or other processes may sort training data 1004 according to one or more categorizations using, for instance, natural language processing algorithms, tokenization, detection of correlated values in raw data and the like; categories may be generated using correlation and/or other processing algorithms. As a non-limiting example, in a corpus of text, phrases making up a number "n" of compound words, such as nouns modified by other nouns, may be identified according to a statistically significant prevalence of n-grams containing such words in a particular order; such an n-gram may be categorized as an element of language such as a "word" to be tracked similarly to single words, generating a new category as a result of statistical analysis. Similarly, in a data entry including some textual data, a person's name may be identified by reference to a list, dictionary, or other compendium of terms, permitting ad-hoc categorization by machine-learning algorithms, and/or automated association of data in the data entry with descriptors or into a given format. The ability to categorize data entries automatedly may enable the same training data 1004 to be made applicable for two or more distinct machine-learning algorithms as described in further detail below. Training data 1004 used by machine-learning module 1000 may correlate any input data as described in this disclosure to any output data as described in this disclosure. As a non-limiting illustrative example, inputs may include image data captured by a camera and outputs may include a positioning datum.

Further referring to FIG. 10, training data may be filtered, sorted, and/or selected using one or more supervised and/or unsupervised machine-learning processes and/or models as described in further detail below; such models may include without limitation a training data classifier 1016. Training data classifier 1016 may include a "classifier," which as used in this disclosure is a machine-learning model as defined below, such as a mathematical model, neural net, or program generated by a machine learning algorithm known as a "classification algorithm," as described in further detail below, that sorts inputs into categories or bins of data, outputting the categories or bins of data and/or labels associated therewith. A classifier may be configured to output at least a datum that labels or otherwise identifies a set of data that are clustered together, found to be close under a distance metric as described below, or the like. A distance metric may include any norm, such as, without limitation, a Pythagorean norm. Machine-learning module 1000 may generate a classifier using a classification algorithm, defined as a processes whereby a computing device and/or any module and/or component operating thereon derives a classifier from training data 1004. Classification may be performed using, without limitation, linear classifiers such as without limitation logistic regression and/or naive Bayes classifiers, nearest neighbor classifiers such as k-nearest neighbors classifiers, support vector machines, least squares support vector machines, fisher's linear discriminant, quadratic classifiers, decision trees, boosted trees, random forest classifiers, learning vector quantization, and/or neural network-based classifiers. As a non-limiting example, training data classifier 1016 may classify elements of training data to a particular vehicle type.

Still referring to FIG. 10, machine-learning module 1000 may be configured to perform a lazy-learning process 1020 and/or protocol, which may alternatively be referred to as a "lazy loading" or "call-when-needed" process and/or protocol, may be a process whereby machine learning is conducted upon receipt of an input to be converted to an output, by combining the input and training set to derive the algorithm to be used to produce the output on demand. For instance, an initial set of simulations may be performed to cover an initial heuristic and/or "first guess" at an output and/or relationship. As a non-limiting example, an initial heuristic may include a ranking of associations between inputs and elements of training data 1004. Heuristic may include selecting some number of highest-ranking associations and/or training data 1004 elements. Lazy learning may implement any suitable lazy learning algorithm, including without limitation a K-nearest neighbors algorithm, a lazy naïve Bayes algorithm, or the like; persons skilled in the art, upon reviewing the entirety of this disclosure, will be aware of various lazy-learning algorithms that may be applied to generate outputs as described in this disclosure, including without limitation lazy learning applications of machine-learning algorithms as described in further detail below.

Alternatively or additionally, and with continued reference to FIG. 10, machine-learning processes as described in this disclosure may be used to generate machine-learning models 1024. A "machine-learning model," as used in this disclosure, is a mathematical and/or algorithmic representation of a relationship between inputs and outputs, as generated using any machine-learning process including without limitation any process as described above, and stored in memory; an input is submitted to a machine-learning model 1024 once created, which generates an output based on the relationship that was derived. For instance, and without limitation, a linear regression model, generated using a linear regression algorithm, may compute a linear combination of input data using coefficients derived during machine-learning processes to calculate an output datum. As a further non-limiting example, a machine-learning model 1024 may be generated by creating an artificial neural network, such as a convolutional neural network comprising an input layer of nodes, one or more intermediate layers, and an output layer of nodes. Connections between nodes may be created via the process of "training" the network, in which elements from a training data 1004 set are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning.

Still referring to FIG. 10, machine-learning algorithms may include at least a supervised machine-learning process 1028. At least a supervised machine-learning process 1028, as defined herein, include algorithms that receive a training set relating a number of inputs to a number of outputs, and seek to find one or more mathematical relations relating inputs to outputs, where each of the one or more mathematical relations is optimal according to some criterion specified to the algorithm using some scoring function. For instance, a supervised learning algorithm may include vehicle type data as described above as inputs, a positioning datum as an output, and a scoring function representing a desired form of relationship to be detected between inputs and outputs; scoring function may, for instance, seek to maximize the probability that a given input and/or combination of elements inputs is associated with a given output to minimize the probability that a given input is not associated with a given output. Scoring function may be expressed as a risk function representing an "expected loss" of an algorithm relating inputs to outputs, where loss is computed as an error function representing a degree to which a prediction generated by the relation is incorrect when compared to a given input-output pair provided in training data 1004. Persons skilled in the art, upon reviewing the entirety of this disclosure, will be aware of various possible variations of at least a supervised machine-learning process 1028 that may be used to determine relation between inputs and outputs. Supervised machine-learning processes may include classification algorithms as defined above.

Further referring to FIG. 10, machine learning processes may include at least an unsupervised machine-learning processes 1032. An unsupervised machine-learning process, as used herein, is a process that derives inferences in datasets without regard to labels; as a result, an unsupervised machine-learning process may be free to discover any structure, relationship, and/or correlation provided in the data. Unsupervised processes may not require a response variable; unsupervised processes may be used to find interesting patterns and/or inferences between variables, to determine a degree of correlation between two or more variables, or the like.

Still referring to FIG. 10, machine-learning module 1000 may be designed and configured to create a machine-learning model 1024 using techniques for development of linear regression models. Linear regression models may include ordinary least squares regression, which aims to minimize the square of the difference between predicted outcomes and actual outcomes according to an appropriate norm for measuring such a difference (e.g. a vector-space distance norm); coefficients of the resulting linear equation may be modified to improve minimization. Linear regression models may include ridge regression methods, where the function to be minimized includes the least-squares function plus term multiplying the square of each coefficient by a scalar amount to penalize large coefficients. Linear regression models may include least absolute shrinkage and selection operator (LASSO) models, in which ridge regression is combined with multiplying the least-squares term by a factor of 1 divided by double the number of samples. Linear regression models may include a multi-task lasso model wherein the norm applied in the least-squares term of the lasso model is the Frobenius norm amounting to the square root of the sum of squares of all terms. Linear regression models may include the elastic net model, a multi-task elastic net model, a least angle regression model, a LARS lasso model, an orthogonal matching pursuit model, a Bayesian regression model, a logistic regression model, a stochastic gradient descent model, a perceptron model, a passive aggressive algorithm, a robustness regression model, a Huber regression model, or any other suitable model that may occur to persons skilled in the art upon reviewing the entirety of this disclosure. Linear regression models may be generalized in an embodiment to polynomial regression models, whereby a polynomial equation (e.g. a quadratic, cubic or higher-order equation) providing a best predicted output/actual output fit is sought; similar methods to those described above may be applied to minimize error functions, as will be apparent to persons skilled in the art upon reviewing the entirety of this disclosure.

Continuing to refer to FIG. 10, machine-learning algorithms may include, without limitation, linear discriminant analysis. Machine-learning algorithm may include quadratic discriminant analysis. Machine-learning algorithms may include kernel ridge regression. Machine-learning algorithms may include support vector machines, including without limitation support vector classification-based regression processes. Machine-learning algorithms may include stochastic gradient descent algorithms, including classification and regression algorithms based on stochastic gradient descent. Machine-learning algorithms may include nearest neighbors algorithms. Machine-learning algorithms may include various forms of latent space regularization such as variational regularization. Machine-learning algorithms may include Gaussian processes such as Gaussian Process Regression. Machine-learning algorithms may include cross-decomposition algorithms, including partial least squares and/or canonical correlation analysis. Machine-learning algorithms may include naïve Bayes methods. Machine-learning algorithms may include algorithms based on decision trees, such as decision tree classification or regression algorithms. Machine-learning algorithms may include ensemble methods such as bagging meta-estimator, forest of randomized trees, AdaBoost, gradient tree boosting, and/or voting classifier methods. Machine-learning algorithms may include neural net algorithms, including convolutional neural net processes.

Figure 11:
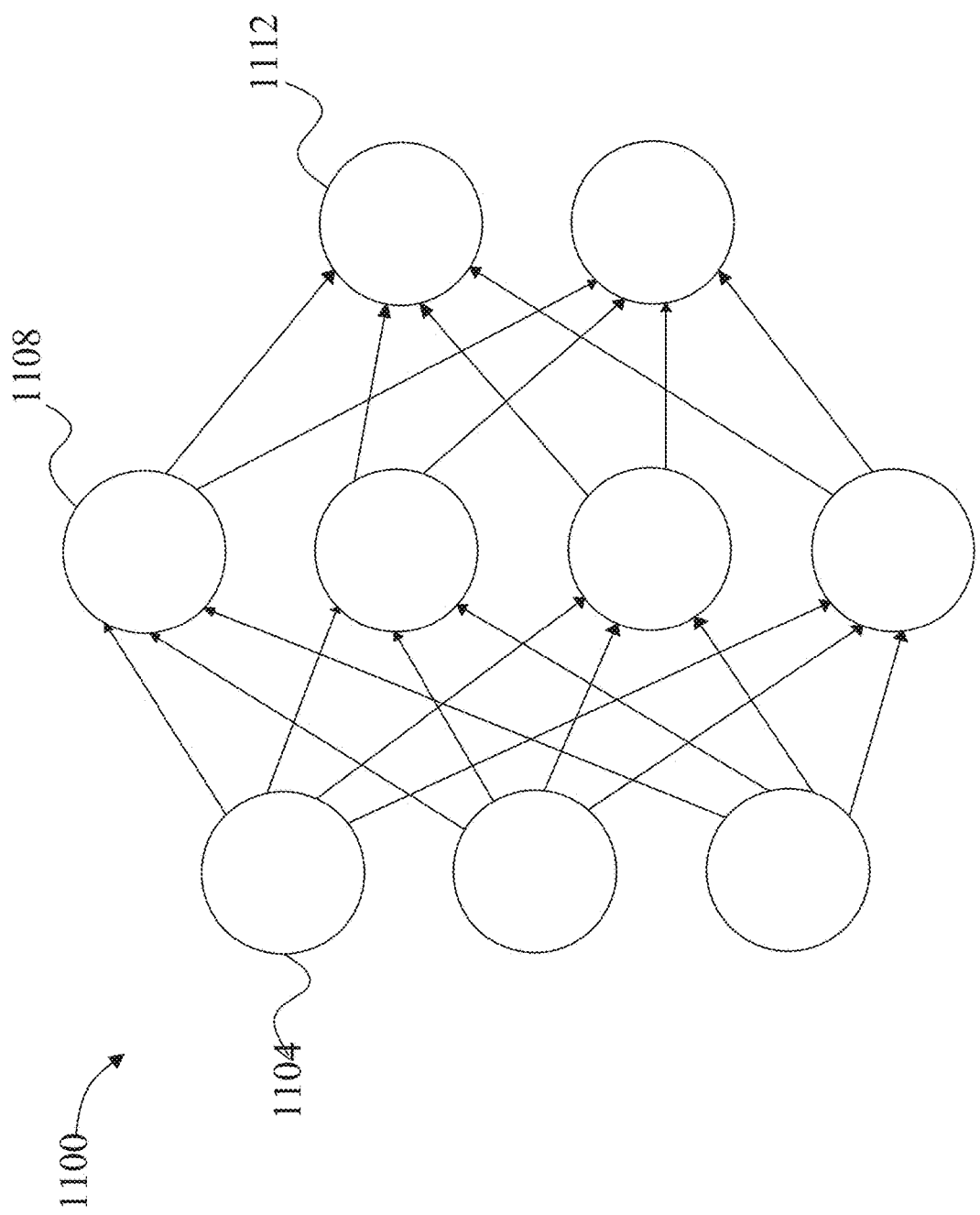
FIG. 11 is a diagram of an exemplary neural network.

Referring now to FIG. 11, an exemplary embodiment of neural network 1100 is illustrated. A neural network 1100 also known as an artificial neural network, is a network of "nodes," or data structures having one or more inputs, one or more outputs, and a function determining outputs based on inputs. Such nodes may be organized in a network, such as without limitation a convolutional neural network, including an input layer of nodes 1104, one or more intermediate layers 1108, and an output layer of nodes 1112. Connections between nodes may be created via the process of "training" the network, in which elements from a training dataset are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning. Connections may run solely from input nodes toward output nodes in a "feed-forward" network, or may feed outputs of one layer back to inputs of the same or a different layer in a "recurrent network." As a further non-limiting example, a neural network may include a convolutional neural network comprising an input layer of nodes, one or more intermediate layers, and an output layer of nodes. A "convolutional neural network," as used in this disclosure, is a neural network in which at least one hidden layer is a convolutional layer that convolves inputs to that layer with a subset of inputs known as a "kernel," along with one or more additional layers such as pooling layers, fully connected layers, and the like.

Figure 12:
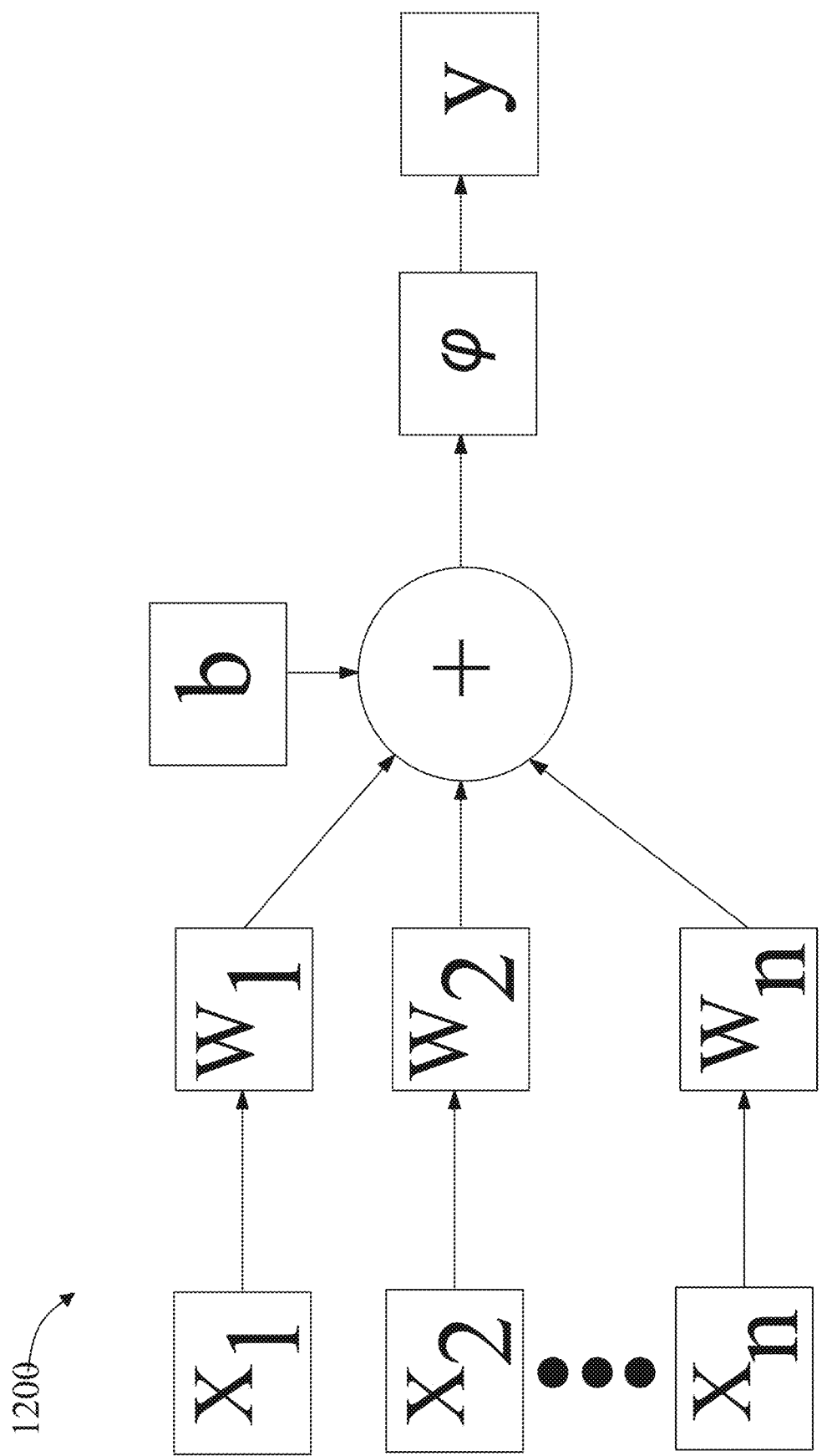
FIG. 12 is a diagram of an exemplary neural network node.

Referring now to FIG. 12, an exemplary embodiment of a node 1200 of a neural network is illustrated. A node may include, without limitation a plurality of inputs $x_i$ that may receive numerical values from inputs to a neural network containing the node and/or from other nodes. Node may perform one or more activation functions to produce its output given one or more inputs, such as without limitation computing a binary step function comparing an input to a threshold value and outputting either a logic 1 or logic 0 output or something equivalent, a linear activation function whereby an output is directly proportional to the input, and/or a non-linear activation function, wherein the output is not proportional to the input. Non-linear activation functions may include, without limitation, a sigmoid function of the form $$f(x) = \frac{1}{1-e^{-x}}$$

given input x, a tahn (hyperbolic tangent) function, of the form $$\frac{e^x - e^{-x}}{e^x + e^{-x}},$$

a tanh derivative function such as $f(x)=\tanh_2(x)$, a rectified linear unit function such as $f(x)=\max(0, x)$, a "leaky" and/or "parametric" rectified linear unit function such as $f(x)=\max(ax, x)$ for some a, an exponential linear units function such as $$f(x) = \begin{cases} x \text{ for } x \geq 0 \\ \alpha(e^x - 1) \text{ for } x < 0 \end{cases}$$

for some value of α (this function may be replaced and/or weighted by its own derivative in some embodiments), a softmax function such as $$f(x_i) = \frac{e^x}{\sum_i x_i}$$

where the inputs to an instant layer are $x_i$, a swish function such as $f(x)=x*\text{sigmoid}(x)$, a Gaussian error linear unit function such as $f(x)=a(1+\tanh(\sqrt{2/\pi}(x+bx^r)))$ for some values of a, b, and r, and/or a scaled exponential linear unit function such as $$f(x) = \lambda \begin{cases} \alpha(e^x - 1) \text{ for } x < 0 \\ x \text{ for } x \geq 0 \end{cases}.$$

Fundamentally, there is no limit to the nature of functions of inputs $x_i$ that may be used as activation functions. As a non-limiting and illustrative example, node may perform a weighted sum of inputs using weights $w_i$ that are multiplied by respective inputs $x_i$. Additionally or alternatively, a bias b may be added to the weighted sum of the inputs such that an offset is added to each unit in the neural network layer that is independent of the input to the layer. The weighted sum may then be input into a function Φ, which may generate one or more outputs y. Weight $w_i$ applied to an input $x_i$ may indicate whether the input is "excitatory," indicating that it has strong influence on the one or more outputs y, for instance by the corresponding weight having a large numerical value, and/or a "inhibitory," indicating it has a weak effect influence on the one more inputs y, for instance by the corresponding weight having a small numerical value. The values of weights $w_i$ may be determined by training a neural network using training data, which may be performed using any suitable process as described above.

Figure 13:
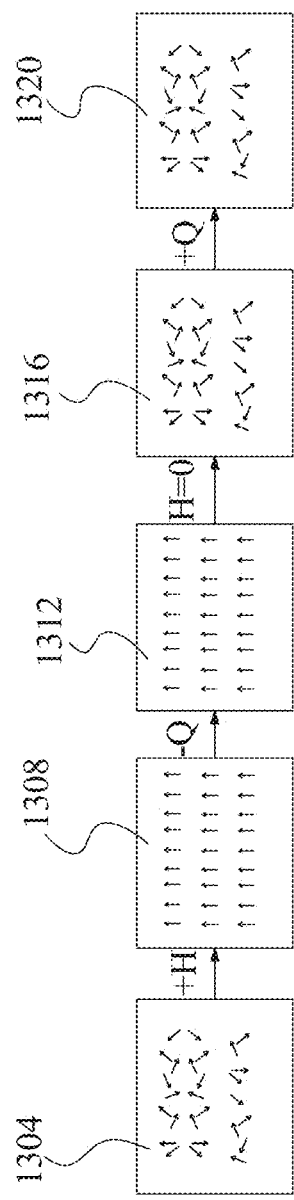
FIG. 13 is a block diagram illustrating an exemplary embodiment of a thermodynamic process for magnetic refrigeration.

Still referring to FIG. 13, an exemplary embodiment of a thermodynamic process for magnetic refrigeration is illustrated. Initially, magnetic material is non-magnetized 1304, having magnetic dipoles that are not aligned. In an adiabatic condition, defined as a condition during which very little heat is exchanged with other substances, the magnetic material is exposed to a magnetic field, aligning the dipoles 1308. This causes an increase in temperature according to the formula:

$$\Delta T_{ad} = -\int_{H_0}^{H_1} \left(\frac{T}{C(T,H)}\right)_H \left(\frac{\partial M(T,H)}{\partial T}\right)_H dH$$

where the integral is evaluated over H the imposed magnetic field, at temperature T, C is the heat capacity of the magnetic material, and M is the magnetization of the magnetic material. At 1312, the magnetized magnetic material is exposed to a cooler reservoir, such as cooling devices as described above, which allows heat to flow out of the material. At 1316, the magnetized material is put into an adiabatic condition again and then the magnetic field is removed, causing the temperature of the magnetic material to drop according to the same equation. This cold material is then exposed 1320 directly or indirectly to the waste heat from apparatus 100, while raising the temperature of the magnetic material. This cycle may be repeated to cool apparatus 100.

One or more element of apparatus 100 may be consistent with an element disclosed in U.S. patent application Ser. No. 18/195,675, filed on May 10, 2023, and titled "AN APPARATUS AND METHOD FOR DISPLAYING DIGITAL CONTENT ONTO A VEHICLE," which is incorporated herein in its entirety by reference.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 14:
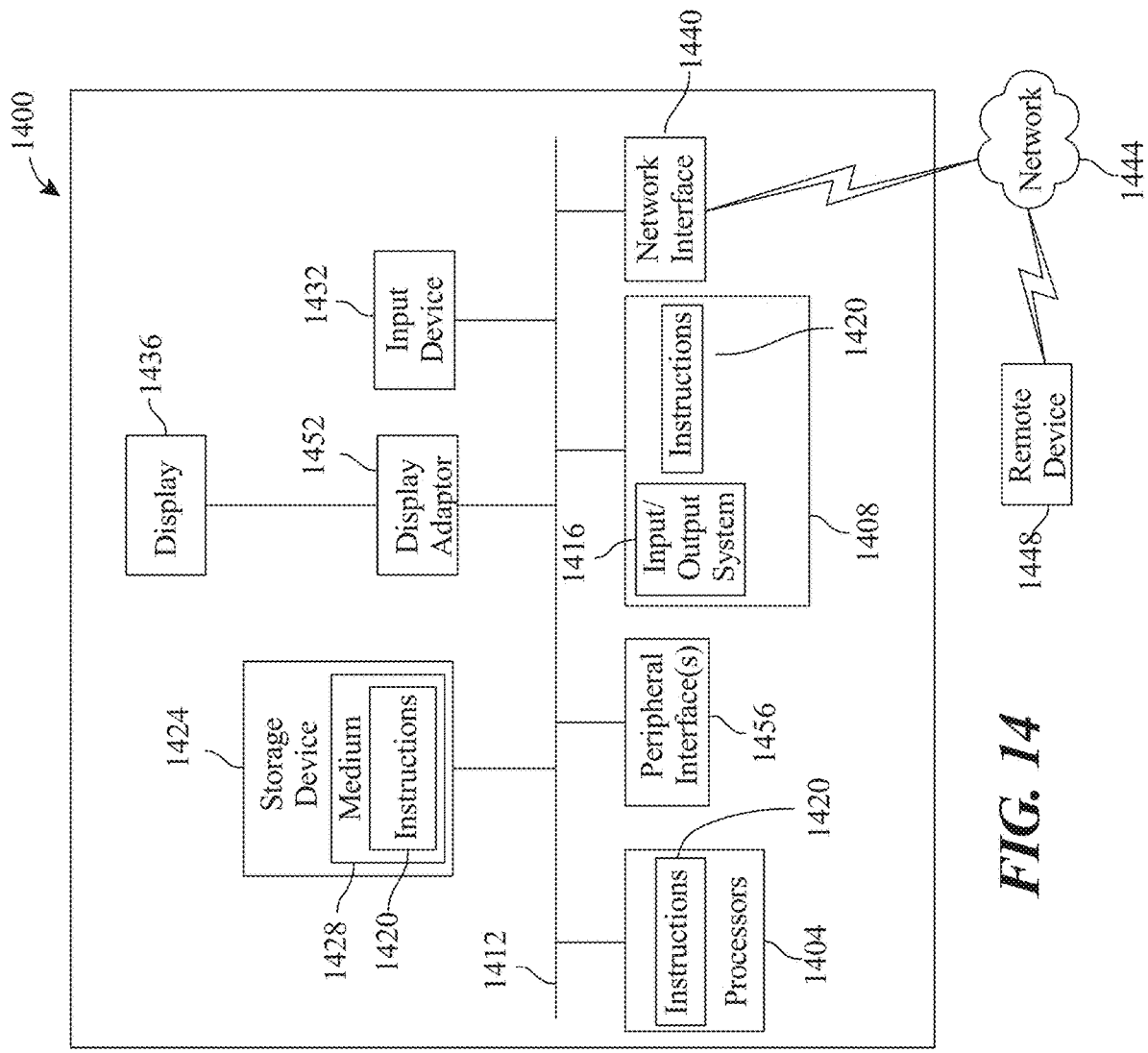
FIG. 14 is a block diagram of a computing system that can be used to implement any one or more of the methodologies disclosed herein and any one or more portions thereof.

FIG. 14 shows a diagrammatic representation of one embodiment of a computing device in the exemplary form of a computer system 1400 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 1400 includes a processor 1404 and a memory 1408 that communicate with each other, and with other components, via a bus 1412. Bus 1412 may include any of several types of bus structures including, but not limited to, a memory bus, a memory controller, a peripheral bus, a local bus, and any combinations thereof, using any of a variety of bus architectures.

Processor 1404 may include any suitable processor, such as without limitation a processor incorporating logical circuitry for performing arithmetic and logical operations, such as an arithmetic and logic unit (ALU), which may be regulated with a state machine and directed by operational inputs from memory and/or sensors; processor 1404 may be organized according to Von Neumann and/or Harvard architecture as a non-limiting example. Processor 1404 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating point unit (FPU), and/or system on a chip (SoC).

Memory 1408 may include various components (e.g., machine-readable media) including, but not limited to, a random-access memory component, a read only component, and any combinations thereof. In one example, a basic input/output system 1416 (BIOS), including basic routines that help to transfer information between elements within computer system 1400, such as during start-up, may be stored in memory 1408. Memory 1408 may also include (e.g., stored on one or more machine-readable media) instructions (e.g., software) 1420 embodying any one or more of the aspects and/or methodologies of the present disclosure. In another example, memory 1408 may further include any number of program modules including, but not limited to, an operating system, one or more application programs, other program modules, program data, and any combinations thereof.

Computer system 1400 may also include a storage device 1424. Examples of a storage device (e.g., storage device 1424) include, but are not limited to, a hard disk drive, a magnetic disk drive, an optical disc drive in combination with an optical medium, a solid-state memory device, and any combinations thereof. Storage device 1424 may be connected to bus 1412 by an appropriate interface (not shown). Example interfaces include, but are not limited to, SCSI, advanced technology attachment (ATA), serial ATA, universal serial bus (USB), IEEE 1494 (FIREWIRE), and any combinations thereof. In one example, storage device 1424 (or one or more components thereof) may be removably interfaced with computer system 1400 (e.g., via an external port connector (not shown)). Particularly, storage device 1424 and an associated machine-readable medium 1428 may provide nonvolatile and/or volatile storage of machine-readable instructions, data structures, program modules, and/or other data for computer system 1400. In one example, software 1420 may reside, completely or partially, within machine-readable medium 1428. In another example, software 1420 may reside, completely or partially, within processor 1404.

Computer system 1400 may also include an input device 1432. In one example, a user of computer system 1400 may enter commands and/or other information into computer system 1400 via input device 1432. Examples of an input device 1432 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 1432 may be interfaced to bus 1412 via any of a variety of interfaces (not shown) including, but not limited to, a serial interface, a parallel interface, a game port, a USB interface, a FIREWIRE interface, a direct interface to bus 1412, and any combinations thereof. Input device 1432 may include a touch screen interface that may be a part of or separate from display 1436, discussed further below. Input device 1432 may be utilized as a user selection device for selecting one or more graphical representations in a graphical interface as described above.

A user may also input commands and/or other information to computer system 1400 via storage device 1424 (e.g., a removable disk drive, a flash drive, etc.) and/or network interface device 1440. A network interface device, such as network interface device 1440, may be utilized for connecting computer system 1400 to one or more of a variety of networks, such as network 1444, and one or more remote devices 1448 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 1444, may employ a wired and/or a wireless mode of communication. In general, any network topology may be used. Information (e.g., data, software 1420, etc.) may be communicated to and/or from computer system 1400 via network interface device 1440.

Computer system 1400 may further include a video display adapter 1452 for communicating a displayable image to a display device, such as display device 1436. Examples of a display device include, but are not limited to, a liquid crystal display (LCD), a cathode ray tube (CRT), a plasma display, a light emitting diode (LED) display, and any combinations thereof. Display adapter 1452 and display device 1436 may be utilized in combination with processor 1404 to provide graphical representations of aspects of the present disclosure. In addition to a display device, computer system 1400 may include one or more other peripheral output devices including, but not limited to, an audio speaker, a printer, and any combinations thereof. Such peripheral output devices may be connected to bus 1412 via a peripheral interface 1456. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve methods, systems, and software according to the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. An apparatus for image projection, the apparatus comprising:
   an image projection device;
   a sealed housing configured to protect the image projection device from a foreign element, the sealed housing comprising an image output window; and
   a cooling system, wherein the cooling system comprises a cooling pad, one or more fans, a plurality of heat exchangers, and a Peltier module, wherein:
   the cooling system is configured to modulate a temperature of the image projection device;
   each of the one or more fans is attached to one of the plurality of heat exchangers; and
   the Peltier module is positioned between the heat exchanger and the cooling pad.

2. The apparatus of claim 1, wherein the Peltier module is configured to transfer heat from the interior of the sealed housing to the exterior of the sealed housing.

3. The apparatus of claim 1, wherein the heat exchanger is configured to exchange heat between the Peltier module and air inside the sealed housing.

4. The apparatus of claim 1, wherein the heat exchanger comprises a finned heat exchanger.

5. The apparatus of claim 1, wherein the one or more fans is configured to blow air from inside the housing into the finned heat exchanger.

6. The apparatus of claim 1, wherein the cooling system further comprises an aluminum plate;
   wherein the one or more fans is configured to blow air in the direction of the aluminum plate.

7. The apparatus of claim 1, wherein the cooling system further comprises a coolant reservoir, wherein the coolant reservoir comprises coolant, and
   wherein the coolant comprises glycol.

8. The apparatus of claim 1, wherein the cooling system further comprises a coolant input and a coolant output;
   wherein the coolant input is configured to deliver coolant to a coolant reservoir;
   wherein the coolant output is configured to remove the coolant from the coolant reservoir.

9. The apparatus of claim 1, wherein the sealed housing is waterproof and airtight.

10. The apparatus of claim 1, further comprising an IO assembly.

11. The apparatus of claim 10, wherein the IO assembly comprises a thermostat, wherein the cooling system is communicatively connected to the thermostat.

12. The apparatus of claim 11, wherein the IO assembly comprises the thermostat and a controller;
   wherein the thermostat is communicatively connected to the controller; and
   wherein the controller is configured to regulate a cooling system activity as a function of a temperature datum received from the thermostat.

13. The apparatus of claim 1, further comprising a mixing fan.

14. The apparatus of claim 1, further comprising a digital signage player, the digital signage player comprising:
   at least a processor; and
   a memory communicatively connected to the at least processor, the memory containing instructions configuring the at least processor to:
      transmit to the image projection device a datum configuring the image projection device to project an image.

15. The apparatus of claim 1, further comprising a power supply.

16. The apparatus of claim 1, further comprising a power input port, a control input port, and an ethernet port, wherein the power input port, control input port, and ethernet port are each positioned on the exterior bottom surface of the sealed housing.

17. The apparatus of claim 1, further comprising a first mounting bracket and a second mounting bracket, wherein the first and second mounting brackets are positioned on opposite edges of the bottom of the exterior of the sealed housing.

18. The apparatus of claim 1, wherein the image projection device is configured to project an image toward a windshield of a vehicle, such that the image is displayed on foam on the windshield of the vehicle, wherein the vehicle is in a car wash.

19. The apparatus of claim 1, wherein the cooling system further comprises thermal grease, insulating foam, and an aluminum spacer, wherein the thermal grease, insulating foam and aluminum spacer are each positioned between a coolant reservoir and the Peltier module.

20. An apparatus for image projection, the apparatus comprising:
   an image projection device;
   a housing configured to protect the image projection device from a foreign element,
      wherein the housing comprises a weep hole and an image output window,
      wherein liquid inside the housing exits through the weep hole; and
   a cooling system comprising a cooling pad;
   wherein the cooling pad comprises a coolant reservoir;
   wherein the cooling system is configured to modulate a temperature of the image projection device.

* * * * *